(12) United States Patent
Khan et al.

(10) Patent No.: US 12,288,983 B2
(45) Date of Patent: Apr. 29, 2025

(54) CONTROLLING FEEDER UNITS FOR SELF-RESTORATION OF POWER

(71) Applicant: Google LLC, Mountain View, CA (US)

(72) Inventors: Hammad Ahmad Khan, Leesburg, VA (US); Kei Hao, Anaheim, CA (US)

(73) Assignee: Google LLC, Mountain View, CA (US)

( * ) Notice: Subject to any disclaimer, the term of this patent is extended or adjusted under 35 U.S.C. 154(b) by 161 days.

(21) Appl. No.: 18/081,058

(22) Filed: Dec. 14, 2022

(65) Prior Publication Data

US 2024/0204517 A1 Jun. 20, 2024

(51) Int. Cl.
*H02J 3/00* (2006.01)
*G01R 19/165* (2006.01)
*H02J 3/38* (2006.01)
*H02J 13/00* (2006.01)

(52) U.S. Cl.
CPC ........ *H02J 3/001* (2020.01); *G01R 19/16547* (2013.01); *H02J 3/381* (2013.01); *H02J 13/00036* (2020.01)

(58) Field of Classification Search
CPC .................................. H02J 3/001; H02J 3/381
See application file for complete search history.

(56) References Cited

U.S. PATENT DOCUMENTS

| | | | |
|---|---|---|---|
| 6,008,971 A | 12/1999 | Duba et al. | |
| 9,733,659 B2 | 8/2017 | Yang et al. | |
| 9,748,797 B2 | 8/2017 | Steinert et al. | |
| 10,838,476 B2 * | 11/2020 | Handy | H02J 4/00 |
| 11,112,815 B1 * | 9/2021 | Wade | H02J 3/001 |
| 11,394,201 B2 | 7/2022 | Delago et al. | |
| 2007/0005193 A1 | 1/2007 | Nelson et al. | |
| 2009/0295231 A1 | 12/2009 | Gaffney et al. | |
| 2010/0231042 A1 | 9/2010 | Weale | |
| 2015/0035358 A1 | 2/2015 | Linkhart et al. | |
| 2018/0241245 A1 | 8/2018 | Ret et al. | |

FOREIGN PATENT DOCUMENTS

| | | |
|---|---|---|
| CN | 106230121 B | 7/2018 |
| EP | 3509180 A1 | 7/2019 |

OTHER PUBLICATIONS

"Automatic Circuit Recloser: Fundamentals" [online]. [Retrieved Dec. 6, 2022] [Retrieved from the internet: <http://<https://www.tavrida.com/tena/solutions/automatic-circuit-reclosers/recloser-fundamentals>, 4 pages.

(Continued)

*Primary Examiner* — Daniel Cavallari
(74) *Attorney, Agent, or Firm* — Lerner David LLP

(57) ABSTRACT

Generally disclosed herein is a power system architecture for controlling self-healing operations for N number of feeder units. The power system architecture may restore power automatically to all feeder units when a loss of power occurs by reconfiguring the status of feeder unit breakers. The power system architecture may also reconfigure and restore power automatically by opening and closing feeder unit breakers when a loss of source returns. The power system architecture may further reconfigure and restore power automatically for as many feeder units as possible under abnormal conditions such as fault scenarios, breaker failures, operation failures, and relay failures.

18 Claims, 19 Drawing Sheets

(56) References Cited

OTHER PUBLICATIONS

"Fundamentals of Automatic Transfer Switches (ATS)" [online] [Retrieved Dec. 6, 2022] Retrieved from the internet: <https://www.eaton.com/us/en-us/products/low-voltage-power-distribution-control-systems/automatic-transfer-switches/automatic-transfer-switch-fundamentals.html>, 22 pages.
"Lucy Electric, Sabr Ring Main Unit" [onlin] {Retrieved Dec. 6, 2022] [Retrieved from the internet: <https://lucyelectric-production-assets.s3.eu-west-2.amazonaws.com/2019/04/Sabre-_-3008-2.pdf> 70 pages.
Extended European Search Report for European Patent Application No. 23169840.8 dated Oct. 27, 2023. 7 pages.
Extended European Search Report for European Patent Application No. 24202500.5 dated Feb. 17, 2025. 10 pages.

\* cited by examiner

CONTROLLING FEEDER UNITS FOR SELF-RESTORATION OF POWER

BACKGROUND

An electric power distribution system is a part of a power system architecture that distributes electric power. Generally, an electric power distribution system includes substations, feeders, switches, electrical loads, control systems, and devices. A Feeder Unit (FdU) may be a switchgear used for power distribution to different loads, such as devices or smaller circuits.

BRIEF SUMMARY

The present disclosure generally relates to a power system architecture capable of self-healing operations for N number of daisy-chained feeder units connected to a power source on each end of the chain. The power system architecture may restore power automatically to some or all of the FdUs by opening and closing FdU breakers to connect a healthy power source when one of the two power sources loses power. The power system architecture may also reconfigure the status of the FdU breakers and restore power automatically by opening and closing FdU breakers when a lost power source returns. The power system architecture may further reconfigure the status of the FdU breakers and restore power automatically for any number of FdUs when fault scenarios, breaker failures, operation failures, relay failures, etc., occur. In addition, the power system architecture may determine not to take any actions when taking an action that would not improve the operation of the system, such as when both power sources cease providing power, as described herein.

One aspect of the technology is directed to a power system architecture comprising: a plurality of feeder units daisy-chained together, each of the plurality of feeder units comprising a voltage bus, two or more breakers, and a feeder unit controller; and a common bus communicatively connecting the feeder unit controllers together, wherein each of the feeder unit controllers is connected to the common bus via one or more communication lines, wherein each of the feeder unit controllers is configured to control the operation of the two or more breakers of the feeder unit comprising the respective feeder unit controller.

In some instances, the plurality of feeder units includes: a first feeder unit at a first end of the daisy-chain connected to a first power source; a second feeder unit at a second end of the daisy-chain connected to a second power source; and one or more interior feeder units positioned between the first feeder unit and the second feeder unit, wherein each of the one or more interior feeder units is connected to immediately adjacent feeder units of the plurality of feeder units.

In some examples, the power system architecture further comprises the first power source and the second power source.

In some examples, each feeder unit controller of the plurality of feeder units is connected to feeder unit controllers of immediately adjacent feeder units via one or more status communication lines.

In some examples, each feeder unit controller is configured to provide status information indicating the operating status of the respective feeder unit controller via the one or more status communication lines.

In some examples, for each feeder unit, a first breaker of the two or more breakers is connected to a first side of the voltage bus and a second breaker of the two or more breakers is connected to a second side of the voltage bus.

In some examples, each feeder unit includes a voltage sensor configured to sense voltage on the voltage bus of the respective feeder unit.

In some examples, the first feeder unit includes a line sensor configured to detect voltage on a line connecting the first power source to the first feeder unit.

In some examples, the second feeder unit includes a line sensor configured to detect voltage on a line connecting the second power source to the first feeder unit.

In some examples, each of the feeder unit controllers is configured to control the operation of the two or more breakers of its respective feeder unit by initiating opening or closing of at least one of the two or more breakers.

In some examples, the power system architecture is operating abnormally when the first feeder unit fails to detect power from the first power source and/or the second feeder unit fails to detect power from the second power source.

In some instances, in normal operation, a single breaker is assigned as a Primary Open Point breaker by the feeder unit controller of the feeder unit having the Primary Open Point breaker.

In some examples, the feeder unit controller of the feeder unit having the Primary Open Point breaker is configured to send on the common bus a shared signal indicating that the Primary Open Point breaker is ready to close.

In some examples, each of the feeder unit controllers, other than the feeder unit controller sending the shared signal indicating that the Primary Open Point breaker is ready to close are configured to send on the common bus a shared signal indicating when one of the two or more breakers within the respective feeder unit is open.

In some examples, the feeder unit controller of the feeder unit having the Primary Open Point breaker is configured to detect, on the common bus, the shared signal indicating when one of the two or more breakers within the respective feeder unit is open.

In some examples, the feeder unit controller of the feeder unit having the Primary Open Point breaker is configured to, upon detecting the shared signal indicating when one of the two or more breakers within the respective feeder unit is open, initiate the closing of the Primary Open Point breaker.

In some examples, the feeder unit controller of the feeder unit having the Primary Open Point breaker is configured to send a shared signal indicating that the Primary Open Point breaker is not ready to close or is already closed on the common bus.

In some examples, the feeder unit controller of the feeder unit having the open breaker is configured to assign the open breaker as a Primary Open Point breaker after detecting the shared signal indicating that the Primary Open Point breaker is not ready to close or is already closed.

In some instances, the plurality of feeder units may be operated in manual or automatic mode.

In some instances, the plurality of feeder units operate independently.

DETAILED DESCRIPTION

Generally disclosed herein are power system architectures and corresponding logic capable of self-healing feeder units. The power system architecture may restore power automatically to all feeder units when a loss of power occurs by reconfiguring the status of the FdU breakers. The power system architecture may designate a breaker as a Primary Open Point breaker that remains open to avoid paralleling two or more independent power sources under normal operation.

Figure 1A:
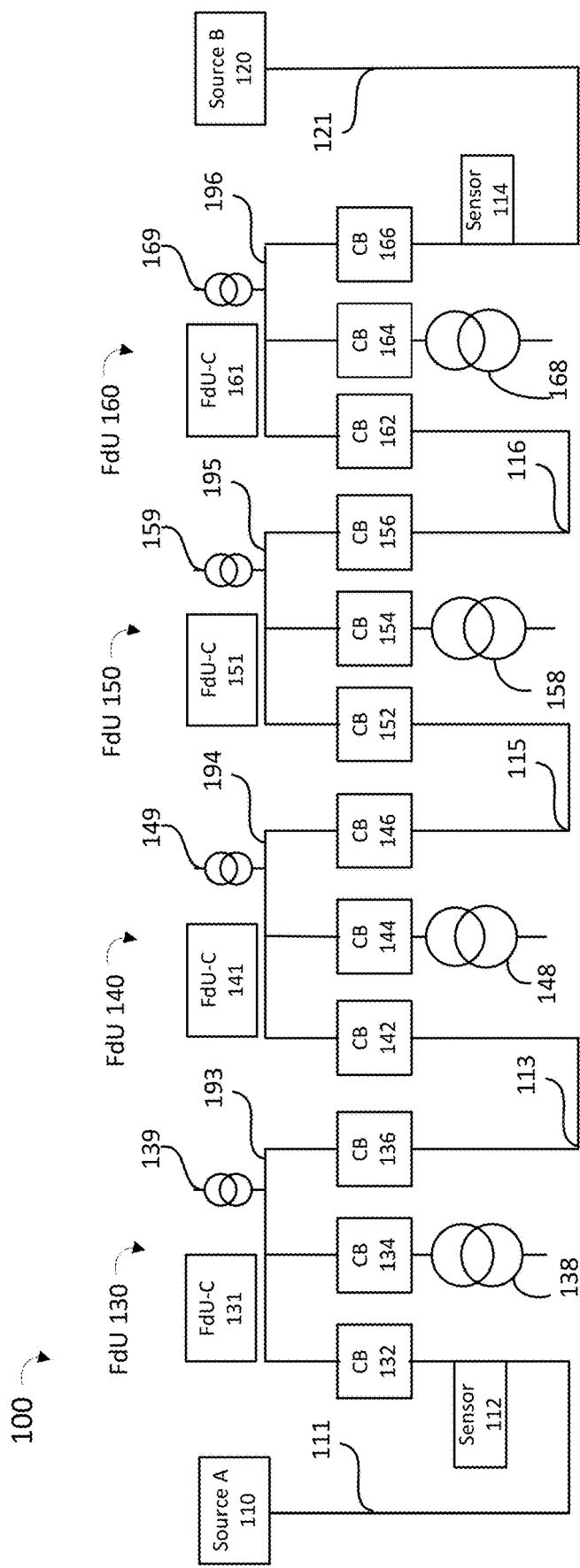
FIG. 1A is a block diagram of an example power system architecture, according to aspects of the disclosure.

As illustrated in FIG. 1A, the power system architecture 100 may have four FdUs forming a FdU loop, including FdU 130, FdU 140, FdU 150, and FdU 160. The first FdU and last FdU of the FdU Loop may be connected to a power source. For example, as further illustrated in FIG. 1A, first FdU 130 is connected to source A 110, and last FdU 160 is connected to source B 120. In other examples, an FdU loop may include any number of FdUs in the loop, from one FdU through "N" FdUs in the loop.

Each FdU may include a feeder unit controller (FdU-C) and three or more circuit breakers or disconnectors. For clarity and consistency, the term breaker(s), as used herein, will be understood to refer to either a circuit breaker or a disconnector unless otherwise specified. For instance, a Prefer Open Point breaker may refer to either a circuit breaker or disconnector that is the Prefer Open Point. Similarly, a Primary Open Point breaker may refer to either a circuit breaker or disconnector that is the Primary Open Point.

For example, as further illustrated in FIG. 1A, FdU 130 includes FdU-C 131, breaker CB 132, breaker CB 134, and breaker CB 136, FdU 140 includes FdU-C 141, breaker CB 142, breaker CB 144, and breaker CB 146, FdU 150 includes FdU-C 151, breaker CB 152, breaker CB 154, and breaker CB 156, and FdU 160 includes FdU-C 161, breaker CB 162, breaker CB 164, and breaker CB 166. Each FdU may communicate with the other FdUs via the FdU-Cs.

One of the breakers within each FdU may be connected to a feeder circuit, or another such load, to supply the loads with power. For example, breaker CB 134 is connected to feeder circuit 138, breaker CB 144 is connected to feeder circuit 148, breaker CB 154 is connected to feeder circuit 158, and breaker CB 164 is connected to feeder circuit 168.

Additionally, sensors, including line and bus sensors may be included in the FdUs. In this regard, the first and last FdUs may include, or otherwise be connected to, line sensors to detect the presence or absence of voltage received from the power sources. For instance, the first FdU 130 includes a line sensor, illustrated as line sensor 112, to detect the presence or absence of voltage received from source A 110 on line 111, which may be considered a power line. FdU 160 includes a line sensor, illustrated as line sensor 114, to detect the presence or absence of voltage received from source B 120 on line 121, which may be considered a power line. In some instances, other FdUs aside from the end FdUs of the loop may also include line sensors. The FdUs may include bus sensors to detect the voltage (or lack thereof) on a bus of the FdU. For instance, FdU 130 includes bus sensor 139 which is configured to detect the voltage on bus 193, FdU 140 includes bus sensor 149 which is configured to detect the voltage on bus 194, FdU 150 includes bus sensor 159 which is configured to detect the voltage on bus 195, and FdU 160 includes bus sensor 169 which is configured to detect the voltage on bus 196. In some instances, the line and bus sensors may detect current instead of, or in addition to, detecting voltage.

Each bus 193, 194, 195, 196 may be a voltage bus configured to provide voltage received from a power source or other FdU to the components of the FdU within which the bus is positioned. For instance, bus 193 may provide voltage received from power source A 110 via line 111 to components within FdU 130, such as FdU-C 131. Bus 193 may also provide the voltage received from power Source A to FdU 140 through a connection with connection line 113 via breaker CB 136. Connection line 113 may provide voltage received from bus 193 to bus 194 of FdU 140 through breaker CB 142. Alternatively, connection line 113 may provide voltage received from bus 194 to FdU 130 through breaker CB 142. Connection line 115 may provide voltage between FdU 140 and 150, and connection line 116 may provide voltage between FdU 150 and 160. Similarly, bus 196 of FdU 160 may provide voltage received from power source B 120 via connection line 121 to components within FdU 160 via the other connection lines and buses.

The line and bus layouts of the power system architecture 100 are but one example of a potential layout of line and bus layouts in a power system architecture. In this regard, the power system architecture may include any number of lines and buses, including intermediary buses and lines. For instance, line 111 may include a number of intermediary lines such that power delivered from power source A traverses more than a single line before reaching FdU 130. In another example, although bus 193 is illustrated as a single bus, bus 193 may comprise two or more buses.

Figure 1B:
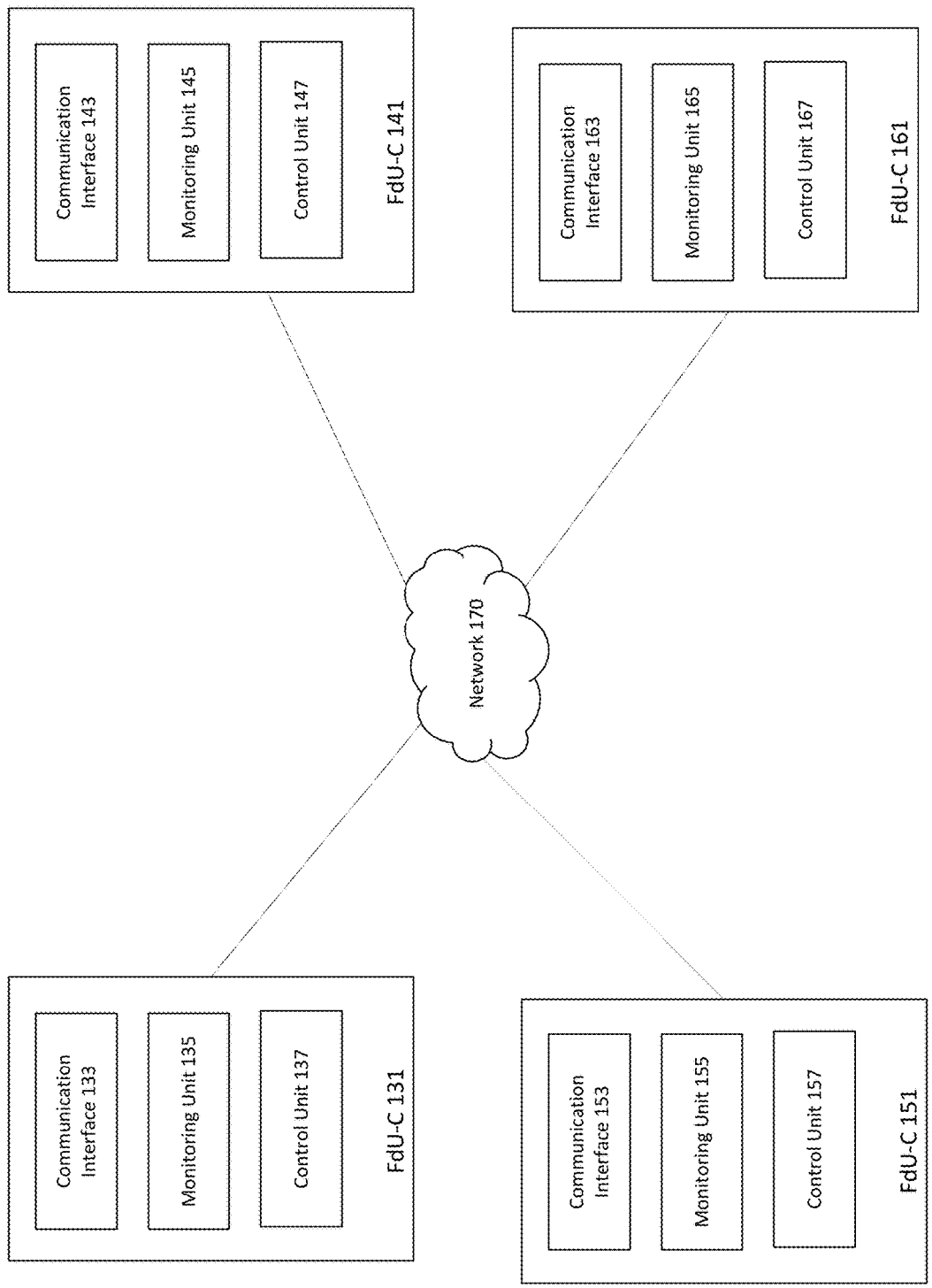
FIG. 1B is a block diagram of an example network system for communication between feeder unit controllers according to aspects of the disclosure.

FIG. 1B depicts a block diagram of an example network system for communication between feeder unit controllers. In this example, FdU-C 131 may include communication interface 133, monitoring unit 135, and control unit 137. FdU-C 141 may include communication interface 143, monitoring unit 145, and control unit 147. FdU-C 151 may include communication interface 153, monitoring unit 155, and control unit 157. FdU-C 161 may include communication interface 163, monitoring unit 165, and control unit 167.

Each communication interface 133, 143, 153, and 163 may be capable of direct and indirect communication with one another over network 170. The network 170 may include various configurations and protocols, including the Internet, World Wide Web, intranets, virtual private networks, wide area networks, local networks, private networks using communication protocols, point-to-point communications, or international standard defining communication protocols, hard-wired, Ethernet, WiFi, and RPC, HTTP, and various combination of the foregoing.

Each FdU-C may include control units 137, 147, 157, and 167, respectively. Each control unit may contain a processor, memory and other components typically present in computing devices. The memory can store information accessible by the processors including instructions that can be executed by the processor. Memory can include data that can be retrieved, manipulated, or stored by the processor. The memory may be a type of non-transitory computer-readable medium capable of storing information accessible by the processor, such as a hard-drive, solid state drive, tape drive, optical storage, memory card, ROM, RAM, DVD, CD-ROM, write-cable, and read-only memory.

Each FdU-C may have a monitoring unit. Monitoring units 135, 145, 155, and 165 may monitor the voltage on a bus or power line (e.g., 111, 121) to detect power loss, breaker failure, FU-C failure, or other such events that may cause voltage changes to occur. In this regard, monitoring units 135, 145, 155, 165 may monitor the sensors of the FUs. For instance, monitoring unit 135 may monitor line sensor 112 for voltage on power line 111 and bus sensor 139 for voltage on bus 193. Monitoring units 145 and 155 may monitor bus sensors 149 and 159 for the voltage on buses 194 and 195, respectively. Monitoring unit 165 may monitor line sensor 114 for voltage on power line 121 and bus sensor 169 for voltage on bus 196.

Figure 1C:
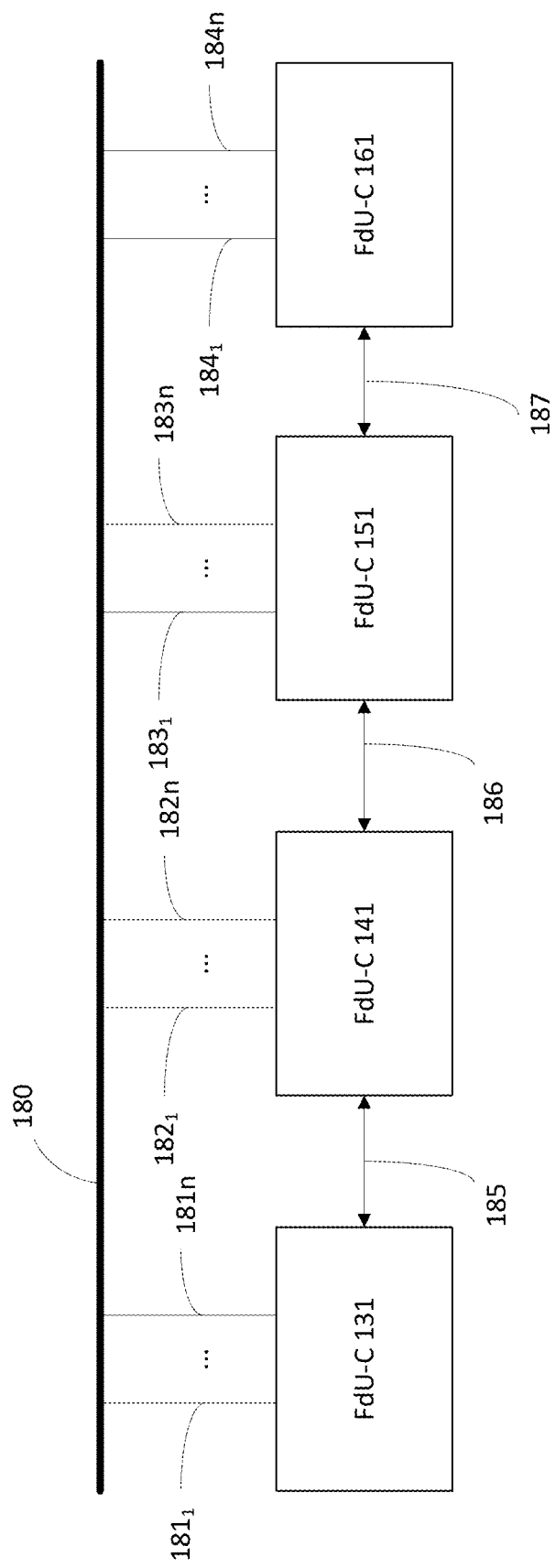
FIG. 1C is a block diagram of an example hard-wired communication interface between feeder unit controllers according to aspects of the disclosure.

FIG. 1C depicts a block diagram of an example hardwired connection between feeder unit controllers 131, 141, 151, 161 via a common bus 180 and communication lines 181-184. Common bus 180 may relay information, referred to herein as "shared signals" from one FdU-C to other FdU-Cs of the power system architecture 100. Shared signals may include whether an FdU has an Open Point, whether a Primary Open Point breaker is ready to close, whether a Primary Open Point breaker failed to close, whether a voltage is present in the loop, and a restoration signal, as described herein. Although common bus 180 is illustrated as a single line, the common bus 180 may include separate lines for each shared signal.

Each FdU-C 131, 141, 151, and 161 may provide shared signals to the common bus 180 via communication lines, such as communication lines 181-184. As illustrated, each FdU-C may have between "1" and "n" communication lines, where "n" is dependent on the number of shared signals being sent and received by an FdU-C. In this regard, each FdU-C may include separate communication lines for each shared signal, with some shared signals having separate communication lines for shared signal reception and transmission. For instance, FdU-C 131 may have communication lines for communicating whether FdU 130 has an Open Point, whether FdU 130 has a Primary Open Point breaker that is ready to close, whether FdU 130 has a Primary Open Point breaker failed to close, whether FdU 130 has a voltage is present in the loop, and a restoration signal.

Each FdU-C 131, 141, 151, and 161 may check the information provided by other FdU-C, such as by checking the shared signals provided by other FU-Cs carried on the common bus 180. For example, FdU-C 131 may receive data indicating whether another FdU-C, such as FdU-C 141, 151, and/or 161 is sensing voltage (or, in some instances, current) via a bus sensor in normal operation. In some examples, FdU-Cs may send and receive information to and from common bus 180 using more than two lines.

Each FdU-C may also send and receive status information of other FdU-C via status lines that pair FdU-Cs. In this regard, and as illustrated, each FdU-C may be directly connected to an adjacent FdU-C via a status line, with FdU-C 131 connected to FdU-C 141 via status line 185, FdU-C 141 connected to FdU-C 151 via status line 186, and FdU-C 151 connected to FdU-C 161 via status line 187. The status information may indicate whether the paired, adjacent FdU-C is operating in normal condition. For instance, FdU-C 161 may receive information via status communication line 187 whether FdU-C 151 is operating in normal condition. In one example, the status information may be a high-signal indicating the FdU-C is operating normally, and a low-signal (or no signal) indicating the FdU-C is operating abnormally.

Figure 2:
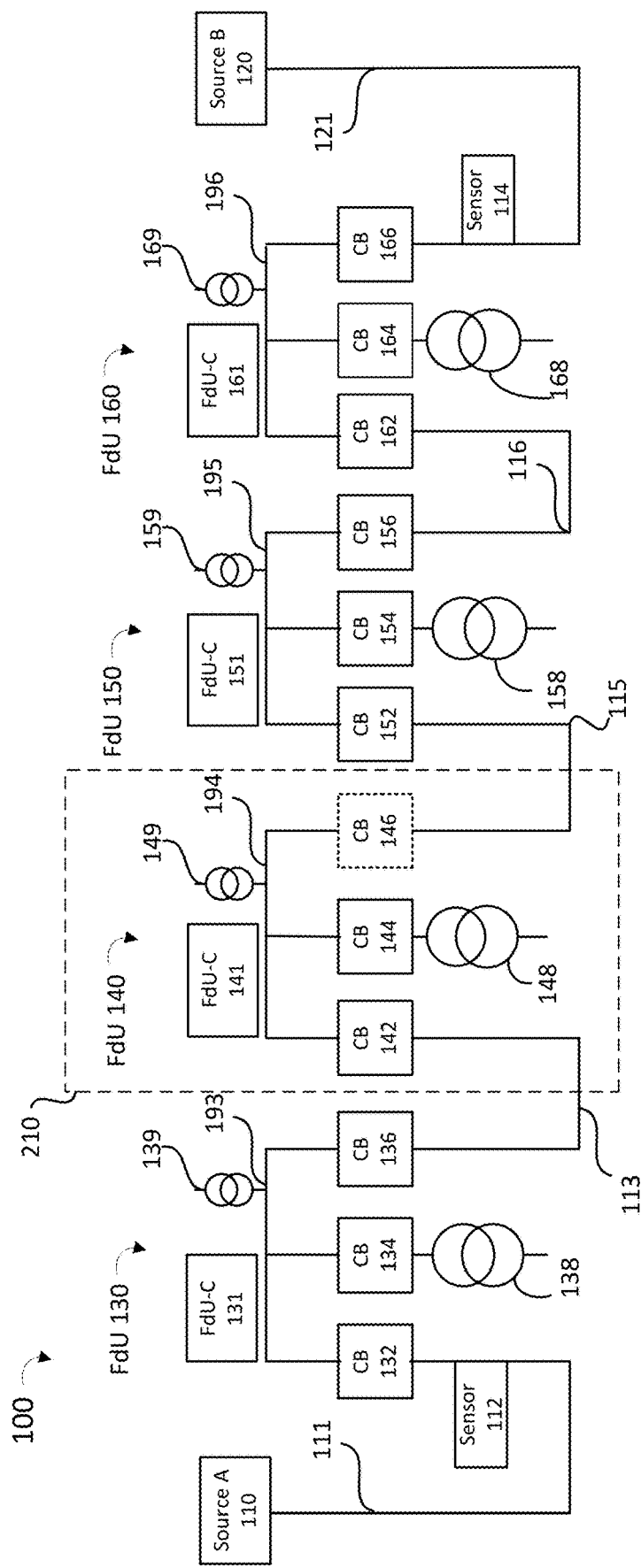
FIG. 2 is a block diagram of an example power system architecture with a Primary Open Point breaker according to aspects of the disclosure.

FIG. 2 depicts a power system architecture 100 operating in normal condition and configured with self-healing logic, as described herein. As illustrated, FdU 140 is initially designated as a primary FdU (Primary FdU), as indicated by dashed box 210. A Primary FdU may be an FdU having a breaker that remains open in normal conditions (referred to herein as an "Open Point") to provide a break between two power sources. For instance, breaker CB 146 within Primary FdU 140 is selected as the Open Point (shown by the dashed line) which provides a break between power source A 110 and power source B 120. An Open Point breaker within the Primary FdU may be designated as a Primary Open Point breaker. In operation, voltage provided by power source A 110 may be transmitted or otherwise provided to FdU 130 via power line 111. Bus 193 may carry the voltage to connection line 113 which may in turn provide voltage to FdU 140. As breaker CB 146 is the Primary Open Point breaker, breaker CB 146 may be open such that voltage from bus 194, provided by power Source A 110, can not pass to connection line 115. Simultaneously, voltage provided by power source B 121 may be transmitted or otherwise provided to FdU 160 via power line 121. Bus 196 may carry the voltage to connection line 116 which may in turn provide voltage to FdU 150. Bus 195 may pass the voltage to connection line 115 which connects to breaker CB 146. As breaker CB 146 is the Primary Open Point breaker, and is open, voltage from connection line 115, provided by Source B 121, cannot pass to bus 194.

Normal conditions may include any situation where the FdUs and power sources are operating without failures or outages. The initial Primary FdU may be programmed into the power system architecture or may be selected manually.

During operation, the power system architecture 100 may perform control checks to ensure the power system architecture 100 is operating normally. In the event the power system architecture 100 is not operating in normal conditions, self-healing operations may be performed, as described herein. The control checks may include determining, based on shared signals and status information, whether the following conditions are satisfied: (1) a presence of a Primary Open Point breaker in the power system architecture; (2) the conditions of the components of the Primary Open Point breaker (e.g., interlocks, spring, etc.) are operating in normal condition; and (3) voltage is present in the FdU loop and at least one of the power sources, source A 110 and source B 120.

Figure 3:
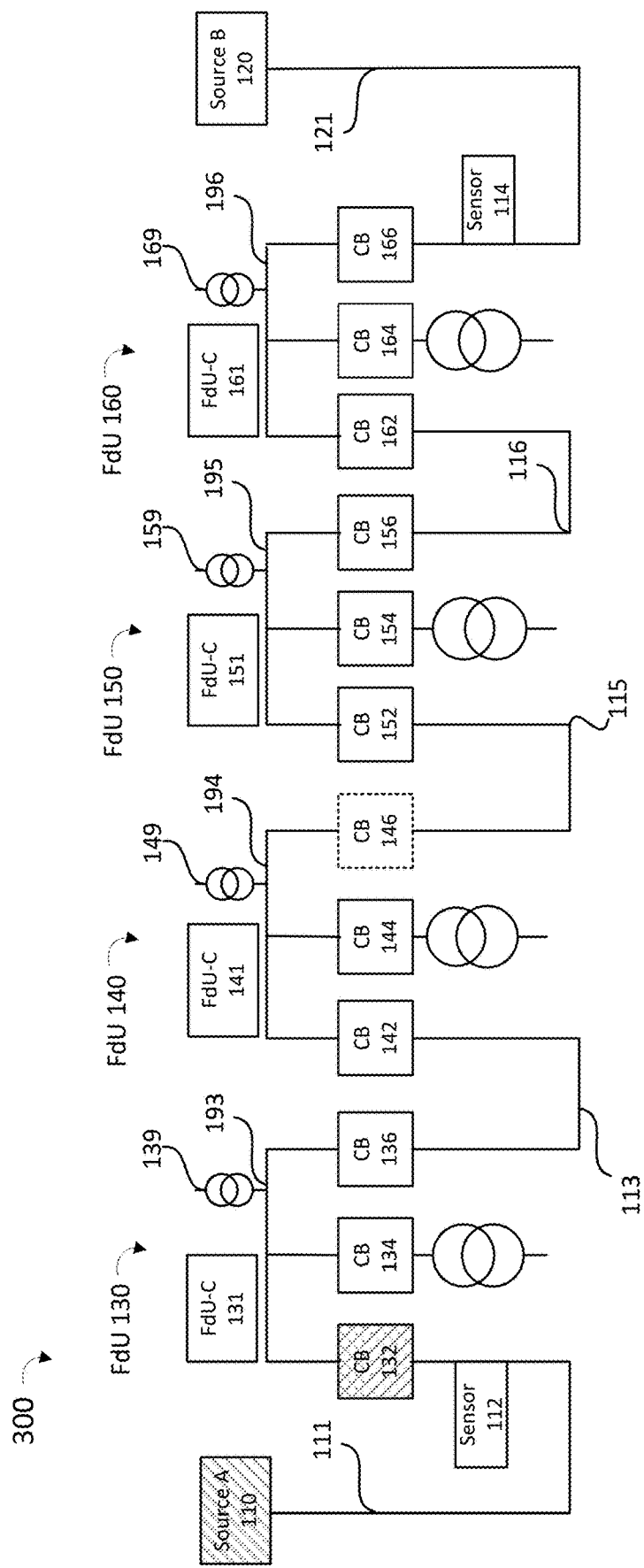
FIG. 3 illustrates the operation of a power system architecture when a single power source is unavailable, according to aspects of the disclosure.

The power system architecture 100 may perform a self-healing control scheme when one of the aforementioned conditions is not met or other conditions described herein are or are not met. Various examples of self-healing logic that can be implemented by the power system architecture in different scenarios are described in more detail below Loss of a Single Power Source FIG. 3 illustrates the operation of a power system architecture 300, which may be compared to power system architecture 100, when a single power source is unavailable. In the example shown in FIG. 3, power system architecture 300 loses source A 110, such as by the power source A failing or a disconnection of the power system architecture 300 from source A 110. The loss of source A 110 is illustrated by shading of source A 110. In normal operation, FdUs 130 and 140 receive power from Source A 110 and FdUs 150 and 160 receive power from Source B 120.

As initially configured, FdU 140 is the Primary FdU and breaker CB 146 is the Primary Open Point breaker. As the Primary Open Point, breaker CB 146 is initially open, as illustrated by the dashed box. In this example, breaker CB 146 is also selected as the Restoration Point. As described in more detail herein, a Restoration Point may be a breaker that becomes a Primary Open Point breaker when a restoration signal is detected. In this regard, when a restoration signal is detected, such as by FdU-C 141, breaker CB 146, as the Restoration Point, may first be assigned as a Prefer Open Point. When breaker CB 146 is open and it is the only Open Point and its breaker interlocks are healthy, then breaker CB 146 may automatically become a Primary Open Point.

After loss of power source A 110, FdU-C 131 may detect a loss of power source based on its bus sensor. For instance, bus sensor 139 may detect a loss of voltage (or current) on bus 193, as power from Source A 110 is no longer received. FdU-C 131 may determine, based on signals provided by bus sensor 139, that no power is available on bus 193. In response to detecting the loss of the power source, FdU-C 131 may assign its end-side breaker as the Prefer Open Point breaker. The end-side breaker is the breaker closest to the power source, which for FdU 130 is breaker CB 132 (indicated by the shading in FIG. 3.)

FdU-C 131 may open the Prefer Open Point (breaker CB 132) if a Primary Open Point Ready to Close signal is received that indicates the Primary Open Point breaker is ready to close. The Primary Open Point Ready to Close signal may be a signal provided by the FdU-C associated with the FdU-C containing the Primary Open Point breaker (such as a high signal or low signal that indicates whether the Primary Open Point is ready to close or not). As previously described, breaker CB 146 is the Primary Open Point breaker. Accordingly, the Primary Open Point Ready to Close signal may be provided by FdU-C 141 to the other FdU-Cs via the common bus 180.

When FdU-C 130 receives the Primary Open Point Ready to Close signal indicating the Primary Open Point breaker is ready to close, FdU-C 131 may open its Prefer Open Point, breaker CB 132, and send a shared signal, via common bus 180, to the other FdU-Cs 140, 150, 160, indicating that FdU 130 has at least one open point-breaker CB 132.

FdU-C 141 may detect the additional open point signal. Further, FdU-C 141 may also determine breaker CB 146, as the Primary Open Point breaker, is also open, indicating that there are two open points in the power system architecture. FdU-C 141 may close breaker CB 146 upon determining there are at least two open points in the power system architecture 300 if the following conditions are met: (1) voltage is present in the loop, such as indicated by a shared signal or determined via one or more sensors; (2) breaker CB 146 interlocks are healthy; and (3) at least two open points exist in the loop. In instances where the Primary FdU is at the other end of the loop (such that it is not located at the end of the loop where a power source is not present), and the Primary Open Point Breaker is the last breaker before the power source, the Primary Open Point breaker may close and Primary Open Point Ready to Close Signal may be High if the FdU-C determines a voltage (or current) is being detected at a line sensor, indicating power is being provided by the power source. After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 131 may detect only one open point in the loop, breaker CB 132. After detecting only one open point, FdU-C 131 may designate its open point (breaker CB 132) as the Primary Open Point breaker if the following conditions are met: (i) only one open point in the loop, (ii) the Prefer Open Point breaker's interlocks (used to control the open and closed status of the breaker) are healthy (in this scenario, breaker CB 132 is the Prefer Open Point breaker); and (iii) the Primary Open Point Ready to Close signal indicates there is no Primary Open Point that is ready to close (e.g., the Primary Open Point Ready to Close signal is low or indicates that the Primary Open Point is already closed.) After determining these conditions are met, FdU-C 131 may assign its Prefer Open Point, breaker CB 132, which is open, as the Primary Open Point breaker. Once FdU-C 131 assigned breaker CB 132 as the Primary Open Point breaker, FdU 130 no longer has a Prefer Open Point, as it has been converted to the Primary Open Point breaker. At the completion of this process, the power system architecture has only one open point (breaker CB 132) and FdU 130 includes the Primary Open Point breaker. Breaker CB 146 of FdU 140 remains the Restoration Point.

Manual Prefer Open Point Selection

Figure 4:
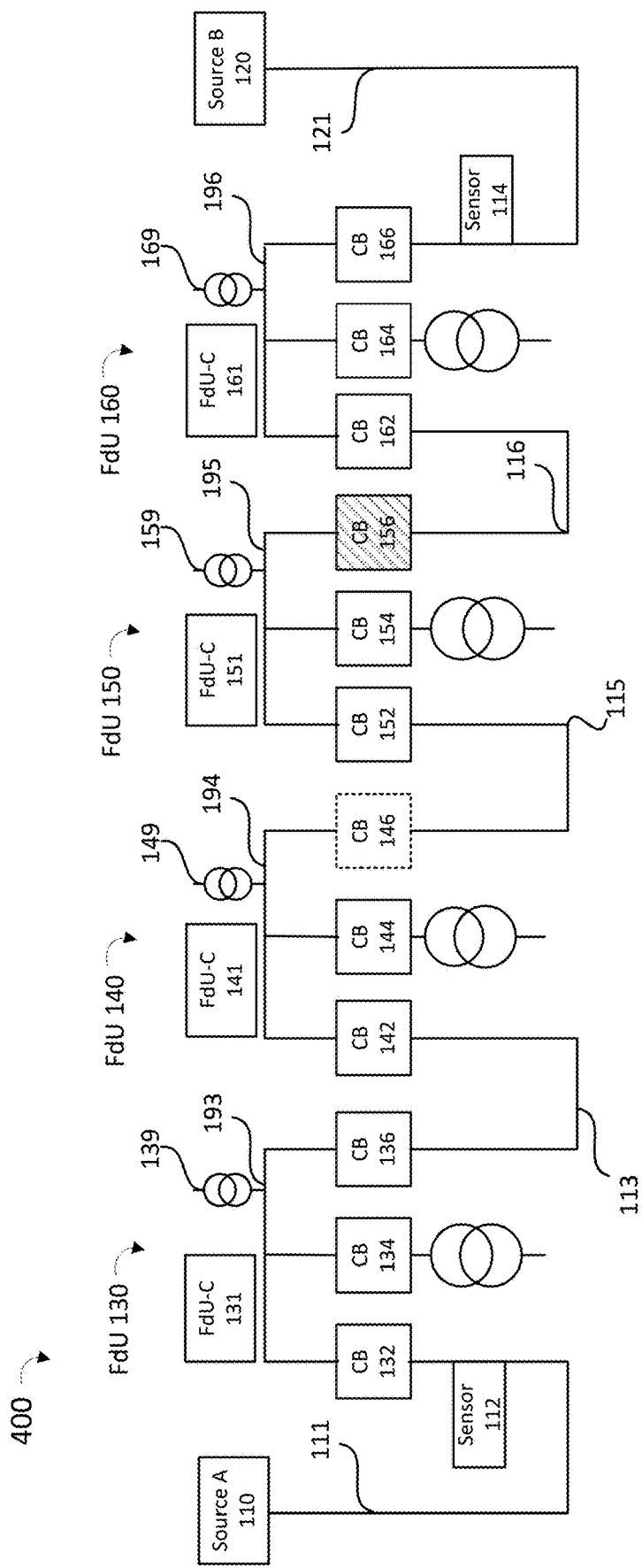
FIG. 4 illustrates the operation of a power system architecture when a Prefer Open Point selection is made, according to aspects of the disclosure.

FIG. 4 illustrates the operation of power system architecture 400, which may be compared to power system architecture 100, when an operator selects a new Prefer Open Point using a selector switch, such as a physical switch, or via other human machine interface (HMI). In the example shown in FIG. 4, FdU 140 is the Primary FdU and breaker CB 146 is the Primary Open Point breaker. The Primary Open Point breaker CB 146 is initially open, as illustrated by the dashed box. In normal operation, FdUs 130 and 140 receive power from Source A 110 and FdUs 150 and 160 receive power from Source B 120. In this example, breaker CB 146 is also selected as the Restoration Point.

An operator, such as a technician or other individual, may manually select a new Prefer Open Point within the power system architecture 400. In the example illustrated in FIG. 4, the operator selects breaker CB 156 of FdU 150 as the Prefer Open Point via a selector switch. After the operator selects the new Prefer Open Point, FdU-C 151 may assign breaker CB 156 as the Prefer Open Point breaker. Subsequently, FdU-C 151 may open the Prefer Open Point breaker if the Primary Open Point Ready to Close signal indicates that the Primary Open Point breaker 146 can be closed and a shared signal indicates that voltage is present in the loop. In the event the Primary Open Point Ready to Close signal indicates the Primary Open Point breaker 146 can be closed and a shared signal indicates that voltage is present in the loop, FdU-C 151 opens its Prefer Open Point breaker 156 and sends a shared signal, via the common bus, for instance, to the other FdU-Cs 130, 140, 160 indicating that FdU 150 has at least one open point.

FdU-C 141 may detect the additional open point signal. Further, FdU-C 141 may also determine that breaker CB 146, as the Primary Open Point breaker, is also open, indicating that there are two open points in the power system architecture. FdU-C 141 may close breaker CB 146 upon determining there are two open points in the power system architecture 400 if the following conditions are met: (1) voltage is present in the loop, such as indicated by a shared signal or determined via one or more sensors; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close and Primary Open Point Ready to Close Signal may be High if the FdU-C determines a voltage (or current) is being detected at a line sensor, indicating power is being provided by the power source. After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 151 may detect only one open point in the loop, Prefer Open Point breaker 156. After detecting only one open point, FdU-C 151 may designate its Prefer Open Point breaker 156 as the Primary Open Point breaker if the following conditions are met: (i) Only one open point in the loop, (ii) the Prefer Open Point breaker's interlocks are healthy (in this scenario, breaker CB 156 is the Prefer Open Point breaker); and (iii) the Primary Open Point Ready to Close signal indicates there is no Primary Open Point that is ready to close (e.g., the Primary Open Point Ready to Close signal is low or indicates that the Primary Open Point is already closed.) After determining the conditions are met, FdU-C 151 may assign its Prefer Open Point, breaker CB 156, which is open, as the Primary Open Point breaker. Once FdU-C 151 assigned breaker CB 156 as the Primary Open Point breaker, FdU 150 no longer has a Prefer Open Point, as it has been converted to the Primary Open Point breaker. At the completion of this process, the power system architecture has only one open point (breaker CB 156), and FdU 150 includes the Primary Open Point breaker. Breaker CB 146 of FdU 140 remains the Restoration Point.

Loss of Two Power Sources

Figure 5:
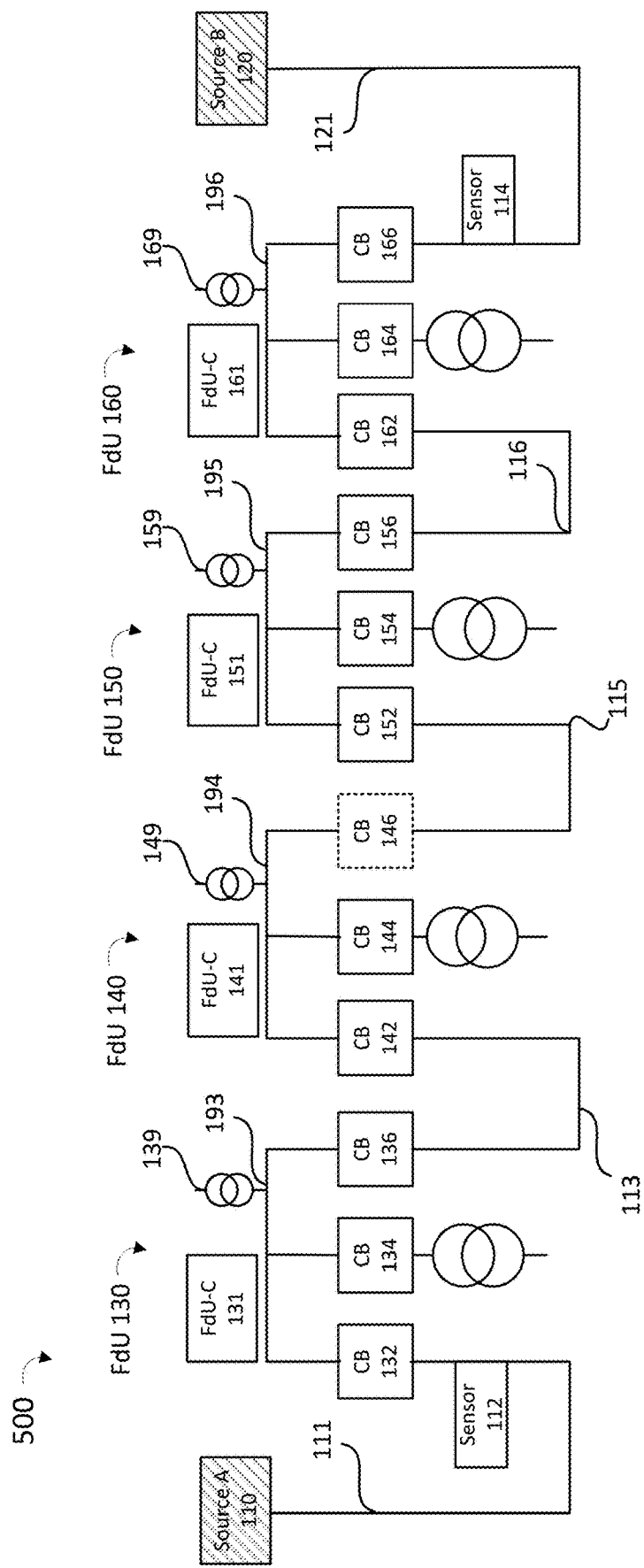
FIG. 5 illustrates the operation of a power system architecture when two power sources are unavailable, according to aspects of the disclosure.

FIG. 5 illustrates the operation of a power system architecture 500, which may be compared to power system architecture 100, when a single power source is unavailable. In the example shown in FIG. 5, power system architecture 500 loses source A 110 and source B 120, such as by the power source A and B failing and/or a disconnection of the power system architecture 500 from source A and B. The loss of source A 110 and source B 120 is illustrated by the shading of source A 110 and source B 120. In normal operation, FdUs 130 and 140 receive power from Source A 110 and FdUs 150 and 160 receive power from Source B 120.

As initially configured, FdU 140 is the Primary FdU and breaker CB 146 is the Primary Open Point breaker. As the Primary Open Point, breaker CB 146 is initially open, as illustrated by the dashed box. In this example, breaker CB 146 is also selected as the Restoration Point.

After the loss of power source A 110, FdU-C 131 may detect a loss of power source based on its bus sensor. For instance, bus sensor 139 may detect a loss of voltage (or current) on bus 193, as power from Source A 110 is no longer received. FdU-C 131 may determine, based on signals provided by bus sensor 139, that no power is available on bus 193.

After the loss of power source B 120, FdU-C 161 may detect a loss of power source based on its bus sensor. For instance, bus sensor 169 may detect a loss of voltage (or current) on bus 196, as power from Source B 120 is no longer received. FdU-C 161 may determine, based on signals provided by bus sensor 169, that no power is available on bus 196.

FdU-C 141 and FdU-C 151 also detect loss of source based on signals provided by their respective bus sensors 149 and 159.

Since no voltage is present in the loop, as the bus and line sensors do not indicate any voltage, FdU-C 141 may transmit a shared signal. In particular, the FdU-C 141 may provide an Primary Open Point Ready to Close signal over the common bus 180, indicating that the Primary Open Point (breaker 146) is not ready to close. FdU-Cs 131, 151, and 161 may detect the Primary Open Point Ready to Close signal indicates that the primary Open Point is not ready to close, and, therefore will take no action. Accordingly, when both power sources fail, no self-healing logic operations which alter the state of the components within the power system architecture 500 are performed.

Automatic Restoration—Return of a Lost Source

Figure 6:
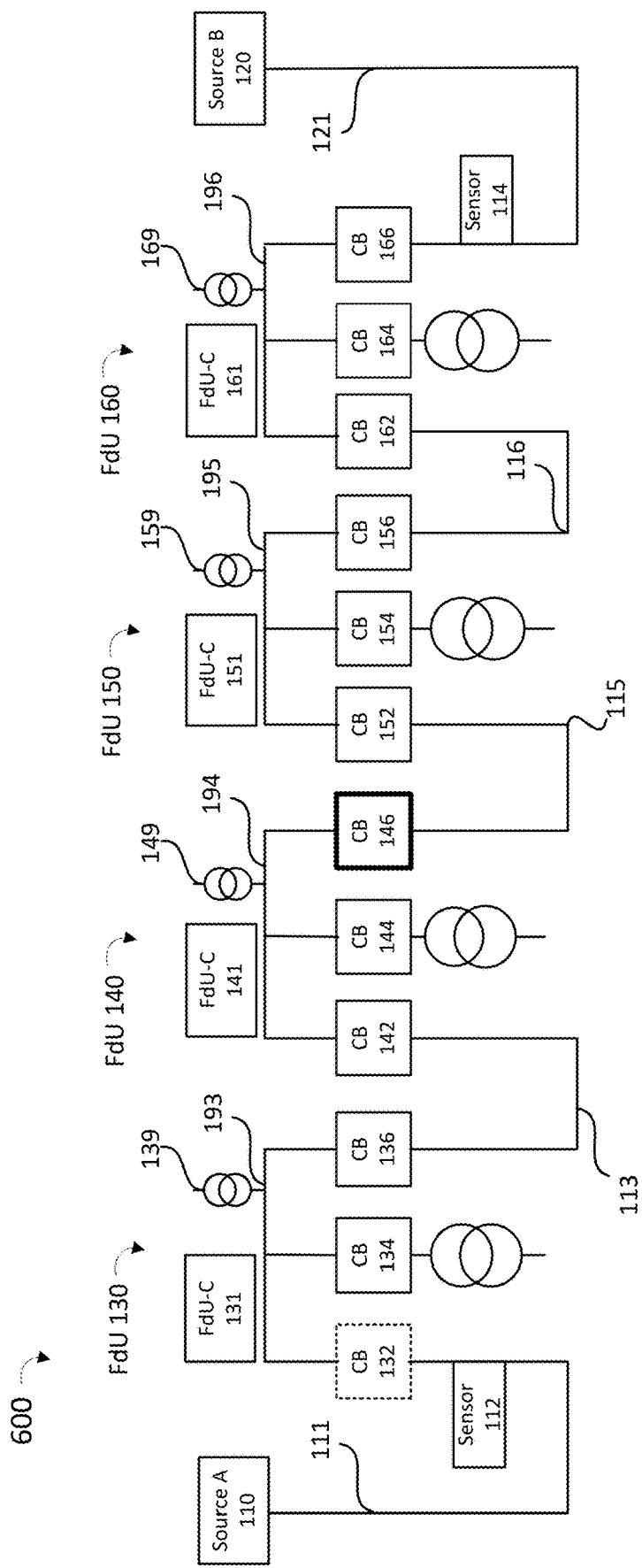
FIG. 6 illustrates the operation of a power system architecture when a power source returns, according to aspects of the disclosure.

FIG. 6 illustrates the operation of a power system architecture 600, which may be compared to power system architecture 100, when a power source resumes providing power. In the example shown in FIG. 6, power source A 110 returns and begins providing power after previously not providing power. As configured in normal operation, FdU 130 is the Primary FdU and breaker CB 132 is the Primary Open Point breaker. As the Primary Open Point, breaker CB 132 is initially open, as illustrated by the dashed box. In this example, breaker CB 146 is the Restoration Point, indicated by the darkened line of the box.

Upon the return of power source A 110, FdU-C 131 may detect source A 110 return using its line sensor 112 on line 111. Upon detected source A has returned, FdU-C 131 may start a restoration timer. The restoration time may be 30 minutes, or some other predefined time. The restoration time may be used to ensure the returned power source is stable before the power system architecture takes any self-healing actions in response to the return of the power source.

After the restoration timer expires or is bypassed by an operator (such as when the operator does not want the power system architecture to wait until the restoration time has completed), FdU-C 131 may send a shared signal to all FU-Cs indicating the power system architecture 600 may start the restoration process. The shared signal may be sent via the common bus 180.

When FdU-C 141 detects the restoration signal, FdU-C 141 may convert Restoration Point (breaker CB 146) into a Prefer Open Point breaker. FdU-C 141 may open the Prefer Open Point breaker 146 if a Primary Open Point Ready to Close signal indicates the Primary Open Point (breaker CB 132) can be closed. If the Primary Open Point Ready to Close signal indicates the Primary Open Point is ready to close, FdU-C 141 may close the Prefer Open Point breaker, breaker CB 146, and transmit a shared signal indicating that a breaker in FdU 140 is open.

FdU-C 131 may detect the additional open point signal provided by FdU-C 141 and also determine breaker CB 132, as the Primary Open Point breaker, is also open, indicating that there are two open points in the power system architecture 600. FdU-C 131 may close breaker CB 132 upon determining there are two open points in the power system architecture 600 if the following conditions are met: (1) voltage is present in the loop, such as indicated by a shared signal or determined via one or more sensors; (2) breaker CB 132 interlocks are healthy; and (3) at least two open points exists in the loop. As FdU 130 is located at the end of the loop and breaker CB 132 is the end breaker, condition (1) will be met if voltage is detected on line 111 by line sensor 112.

After determining the aforementioned conditions are met, FdU-C 131 may (i) close Primary Open Point breaker CB 132, (ii) once the Primary Open Point breaker CB 132 is closed, clear Primary Open Point status from FdU 130, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 141 may detect only one open point in the loop, Prefer Open Point breaker 146. After detecting only one open point, FdU-C 141 may designates its Prefer Open Point breaker 146 as the Primary Open Point breaker if the following conditions are met: (i) Only one open point in the loop, (ii) the Prefer Open Point breaker's interlocks are healthy (in this example, breaker CB 146 is the Prefer Open Point Breaker); and (iii) the Primary Open Point Ready to Close signal indicates there is no Primary Open Point that is ready to close (e.g., the Primary Open Point Ready to Close signal is low or indicates that the Primary Open Point is already closed.) After determining the conditions are met, FdU-C 141 may assign its Prefer Open Point, breaker CB 146, which is open, as the Primary Open Point breaker. Once FdU-C 141 assigned breaker CB 146 as the Primary Open Point breaker, FdU 140 no longer has a Prefer Open Point, as it has been converted to the Primary Open Point breaker. At the completion of this process, the power system architecture has only one open point (breaker CB 146) and FdU 140 includes the Primary Open Point breaker. Breaker CB 146 of FdU 140 remains as the Restoration Point.

Cable Fault Between a Power Source and an End Feeder Unit

Figure 7:
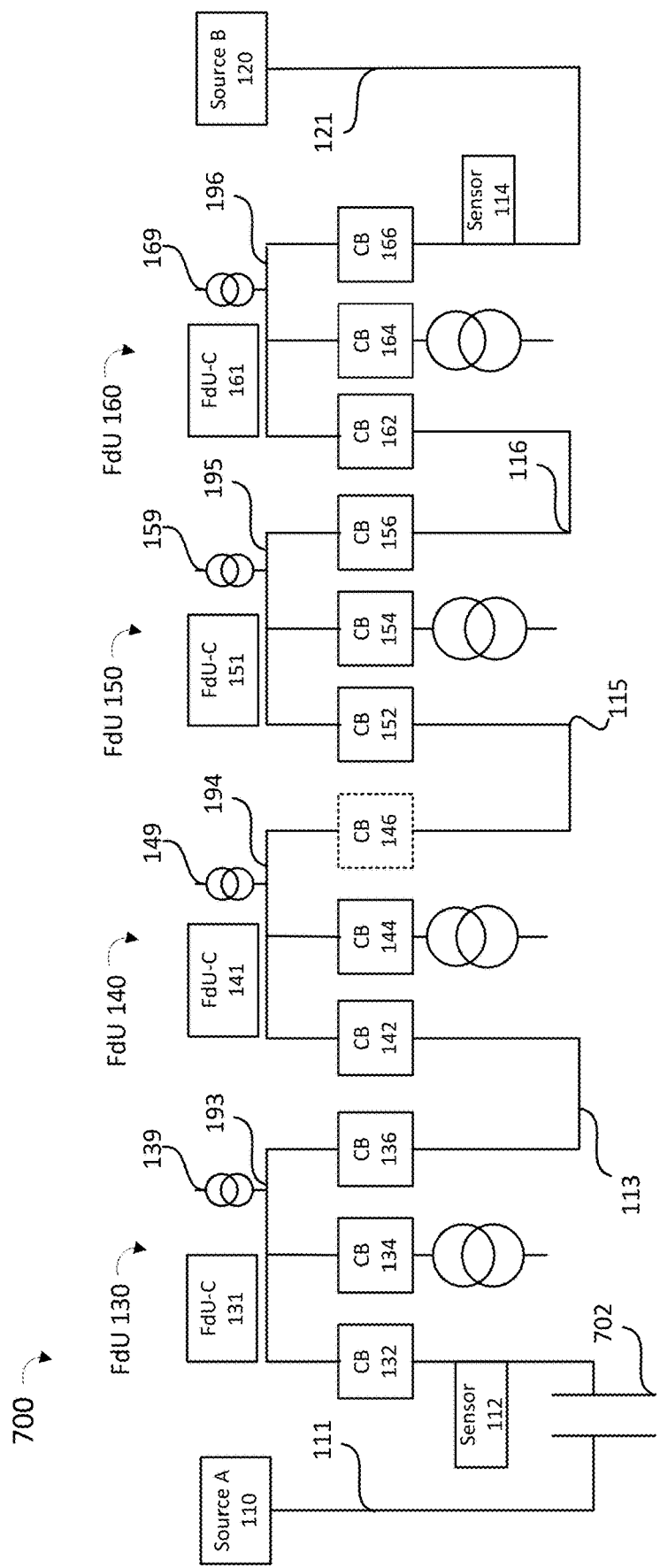
FIG. 7 illustrates the operation of a power system architecture when a cable fault occurs between a power source and a feeder unit, according to aspects of the disclosure.

FIG. 7 illustrates the operation of a power system architecture 700, which may be compared to power system architecture 100, when a cable fault between a power source and an end feeder unit occurs. The cable fault, illustrated by break 702 of line 111, occurs between Source A 110 and end feeder unit FdU 130. As configured in normal operation, FdU 140 is the Primary FdU and breaker CB 146 is the Primary Open Point breaker. As the Primary Open Point, breaker CB 146 is initially open, as illustrated by the dashed box. In this example, breaker CB 146 is also the Restoration Point.

Upon the cable fault occurring, a breaker at Source A 110 (not shown) may trip and breaker 132 of FdU 130 may also trip and is locked due to a lockout relay (LOR). FdU-C 131 may detect a loss of a power source, as no power will be received from Source A 110 due to the fault. For instance, bus sensor 139 may detect a loss of voltage (or current) on bus 193, as power from Source A 110 is no longer received. FdU-C 131 may determine, based on signals provided by bus sensor 139, that no power is available on bus 193. FdU-C 131 may also detect that its end-side breaker, breaker 132, has tripped and, in response, send a shared signal to other FdU-Cs indicating that FdU 130 has at least one open point. The shared signal may be transmitted via common bus 180.

FdU-C 141, may detect the shared signal from FdU-C 131 and determine, based on determining that breaker CB 146, as the Primary Open Point breaker, is also open, that at least two open points exist in the power system architecture loop. After determining two open points exist in the power system architecture, FdU-C 141 may close Primary Open Point breaker 146 if the following conditions are met: (1) voltage is present in the loop; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source.

After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 131 may detect only one open point in the loop, breaker 132. After detecting only one open point, FdU-C 131 may designate breaker 132 as the Primary Open Point breaker if the following conditions are met: (i) Only one open point in the loop, (ii) the Prefer Open Point breaker's interlocks are healthy; and (iii) the Primary Open Point Ready to Close signal indicates there is no Primary Open Point that is ready to close (e.g., the Primary Open Point Ready to Close signal is low or indicates that the Primary Open Point is already closed.) In this scenario, conditions (i) and (iii) are met, but not condition (ii) because the interlocks of breaker 132 are not healthy. Accordingly, FdU-C 131 self-healing logic is not active as a Primary Open Point is undetermined.

Cable Fault Between Feeder Units

Figure 8:
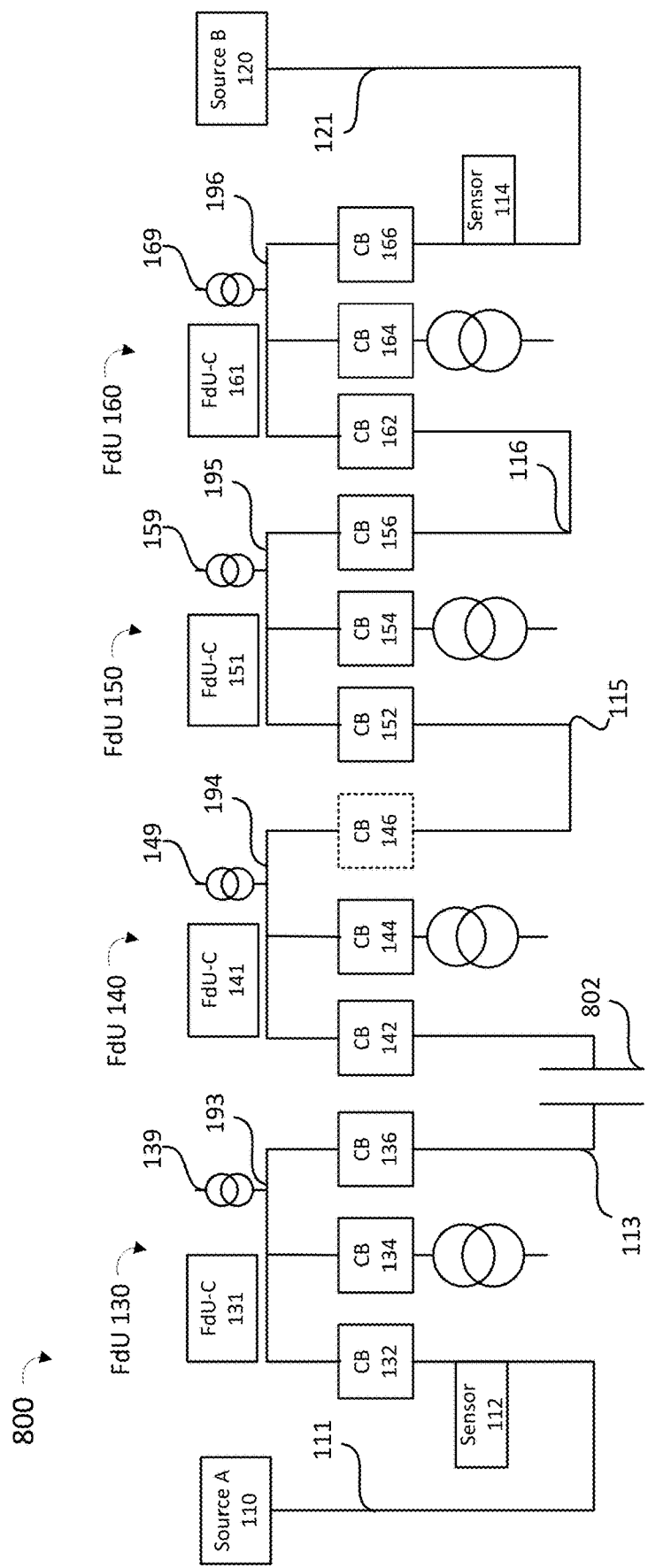
FIG. 8 illustrates the operation of a power system architecture when a cable fault occurs between feeder units, according to aspects of the disclosure.

FIG. 8 illustrates the operation of a power system architecture 800, which may be compared to power system architecture 100, when a cable fault occurs. The cable fault in FIG. 8 is illustrated by break 802 of line 113, which occurs between FdU 130 and FdU 140. As configured in normal operation, FdU 140 is the Primary FdU and breaker CB 146 is the Primary Open Point breaker. As the Primary Open Point, breaker CB 146 is initially open, as illustrated by the dashed box. In this example, breaker CB 146 is also the Restoration Point.

Upon the cable fault occurring, breaker CB 136 of FdU 130 and breaker CB 142 of FdU 140 may trip due to the cable fault are locked due to a lockout relay (LOR). FdU-C 131 may detect that its breaker, breaker 136, has tripped and, in response, send a shared signal to other FdU-Cs indicating that FdU 130 has at least one open point. The shared signal may be transmitted via common bus 180.

FdU-C 141, may detect the shared signal from FdU-C 131 and determine, based on determining that breaker CB 146, as the Primary Open Point breaker, is also open, that at least two open points exist in the power system architecture loop. After determining two open points exist in the power system architecture, FdU-C 141 may close Primary Open Point breaker 146 if the following conditions are met: (1) voltage is present in the loop, such as indicated by a shared signal or determined via one or more sensors; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source.

If the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.) FdU-C 141 may also send a shared signal to the other FdU-Cs indicating that at least one open point, breaker CB 142, is present at FdU 140.

After the Primary Open Point breaker 146 is closed, FdU-C 131 and FdU-C 141 may detect two open points in the loop, breaker CB 136 of FdU 130 and breaker CB 142 of FdU 140. As FdU-C 131 and FdU-C 141 each detect two open points, neither FdU-C may be able to designate its open point as the Primary Open Point, as conditions (i) and (ii) of the following conditions are not met: (i) only one open point in the loop, (ii) the interlocks of breakers in FdUs 130 and 140 are healthy; and (iii) the Primary Open Point Ready to Close signal indicates there is no Primary Open Point that is ready to close (e.g., the Primary Open Point Ready to Close signal is low or indicates that the Primary Open Point is already closed.) Accordingly, FdU-C 131 and FdU-C 141 self-healing logic is not active and a Primary Open Point remains undetermined.

Cable Fault Between Feeder Units Involving a Primary Open Point

Figure 9:
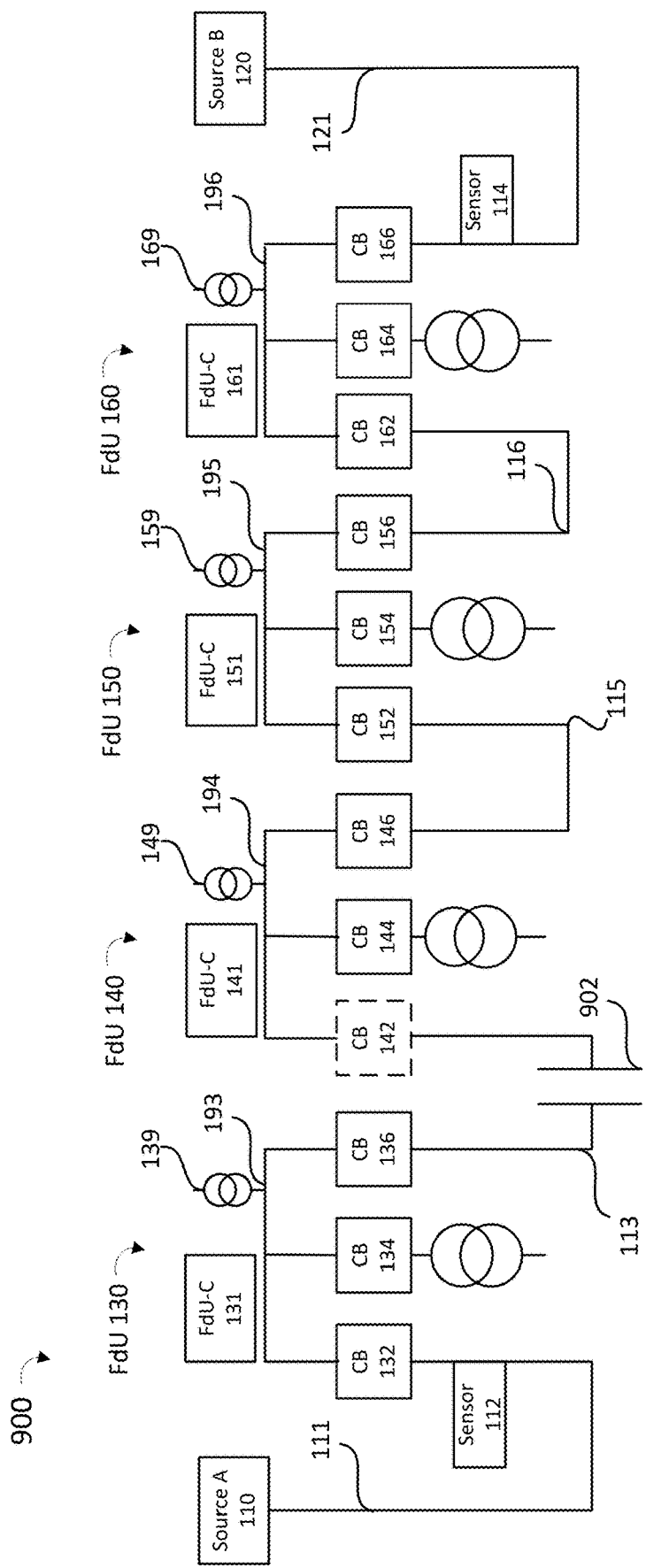
FIG. 9 illustrates the operation of a power system architecture when a cable fault occurs between feeder units involving a primary open point, according to aspects of the disclosure.

FIG. 9 illustrates the operation of a power system architecture 900, which may be compared to power system architecture 100, when a cable fault, illustrated by break 902 of line 113, occurs between FdU 130 and FdU 140. As configured in normal operation, FdU 140 is the Primary FdU and breaker CB 142 is the Primary Open Point breaker. As the Primary Open Point, breaker CB 142 is initially open, as illustrated by the dashed box. In this example, breaker CB 142 is also the Restoration Point.

Upon the cable fault occurring, breaker CB 136 of FdU 130 and breaker CB 142 of FdU 140 may trip due to the cable fault. FdU-C 131 may detect that its breaker, breaker 136, has tripped and, in response, send a shared signal to other FdU-Cs indicating that FdU 130 has at least one open point. The shared signal may be transmitted via common bus 180.

FdU-C 141 may detect that breaker CB 142, as the Primary Open Point breaker, is locked due to a lockout relay (LOR). Based on this detection of the Primary Open Point breaker CB 142 being locked, FdU-C 141 may send a shared signal to other FdU-Cs indicating that FdU 140 has at least one open point. FdU-C may also remove the Primary Open Point status of breaker CB 142 and the Restoration Point status of CB 142.

Based on the shared signals indicating that breakers in FdU 130 and FdU 140 are opened, FdU-C 131 and FdU-C 141 may each detect two open points in the loop. In this regard, FdU-C 131 may detect the shared signal sent by FdU-C 141 and FdU-C may detect the shared signal sent by FdU-C 131. Further, FdU-C 131 may determine breaker CB 136 is open and FdU-C 141 may determine breaker 142 is open. However, FdU-C 131 may not designate breaker CB 136 as a Primary Open Point nor may FdU-C 141 breaker CB 142 as a Primary Open Point, as conditions (i) and (ii) of the following conditions are not met: (i) only one open point in the loop, (ii) the interlocks of breakers in FdUs 130 and 140 are healthy; and (iii) the Primary Open Point Ready to Close signal indicates there is no Primary Open Point that is ready to close (e.g., the Primary Open Point Ready to Close signal is low or indicates that the Primary Open Point is already closed.) Accordingly, FdU-C 131 and FdU-C 141 self-healing logic is not active and a Primary Open Point is undetermined.

Bus Fault

Figure 10:
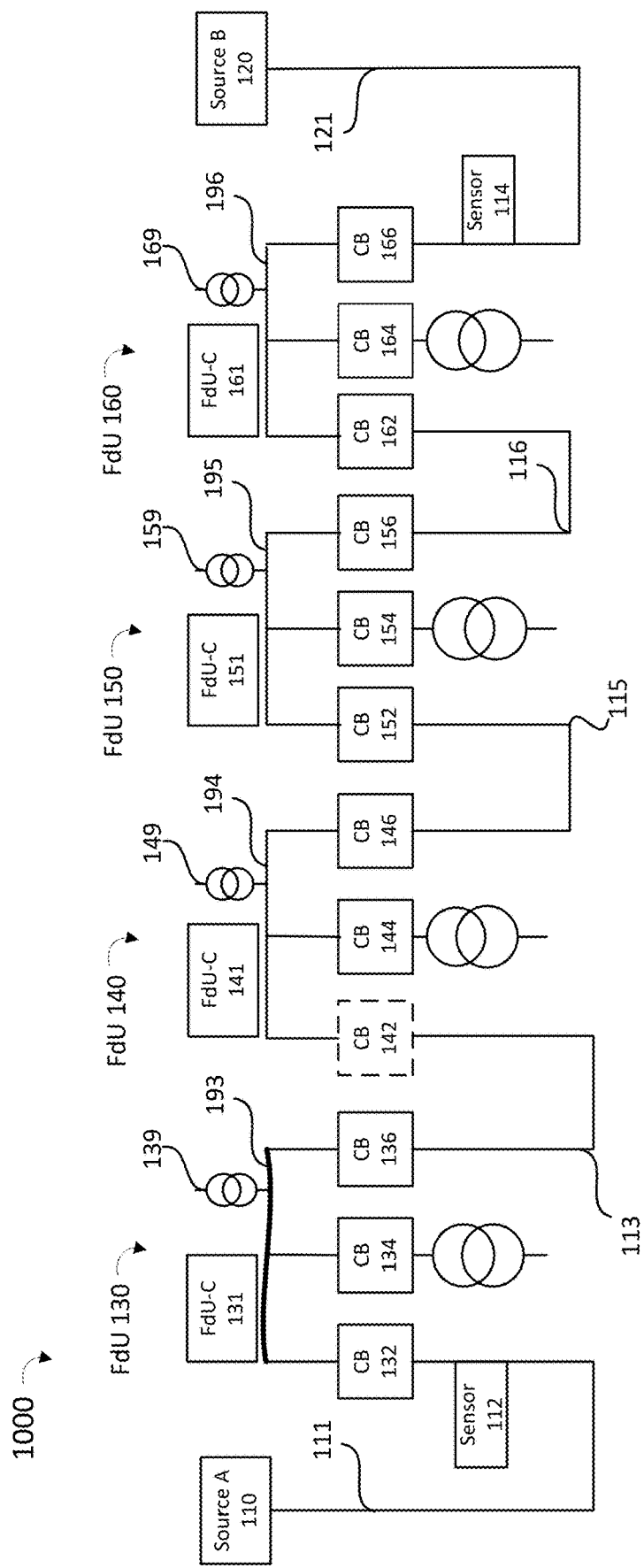
FIG. 10 illustrates the operation of a power system architecture when a bus fault occurs, according to aspects of the disclosure.

FIG. 10 illustrates the operation of a power system architecture 1000, which may be compared to power system architecture 100, when a bus fault occurs. The bus fault in FIG. 10 is represented by the curved illustration of bus 193 in FdU 130. As configured in normal operation, FdU 140 is the Primary FdU and breaker CB 142 is the Primary Open Point breaker. As the Primary Open Point, breaker CB 142 is initially open, as illustrated by the dashed box. In this example, breaker CB 142 is also the Restoration Point.

As a result of the bus fault occurring, breakers CB 132, 134, and 136 of FdU 130 trip is locked due to a lockout relay (LOR). FdU-C 131 may detect that breakers CB 132 and 136 have tripped and, in response, send a shared signal to other FdU-Cs indicating that FdU 130 has at least one open point. The shared signal may be transmitted via common bus 180.

FdU-C 141, may detect the shared signal from FdU-C 131 and determine, based on determining that breaker CB 142, as the Primary Open Point breaker, is also open, that at least two open points exist in the power system architecture loop. After determining at least two open points exist in the power system architecture 1000, FdU-C 141 may close Primary Open Point breaker 142 if the following conditions are met: (1) voltage is present in the loop; (2) breaker CB 142 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source.

After determining the aforementioned conditions are met, FdU-C 141 may (i) close Primary Open Point breaker CB 142, (ii) once the Primary Open Point breaker CB 142 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 142 is closed, FdU-C 131 may detect at least two open points in the loop, breakers CB 132 and 136. However, FdU-C 131 may be unable to designate any open breakers as a Primary Open Point, as conditions (i) and (ii) of the following conditions are not met: (i) only one open point in the loop, (ii) the interlocks for the breakers of FdU 130 are healthy; and (iii) the Primary Open Point Ready to Close signal indicates there is no Primary Open Point that is ready to close (e.g., the Primary Open Point Ready to Close signal is low or indicates that the Primary Open Point is already closed.) Accordingly, FdU-C 131 self-healing logic is not active and a Primary Open Point is undetermined.

Failure of a Breaker to Open

Figure 11:
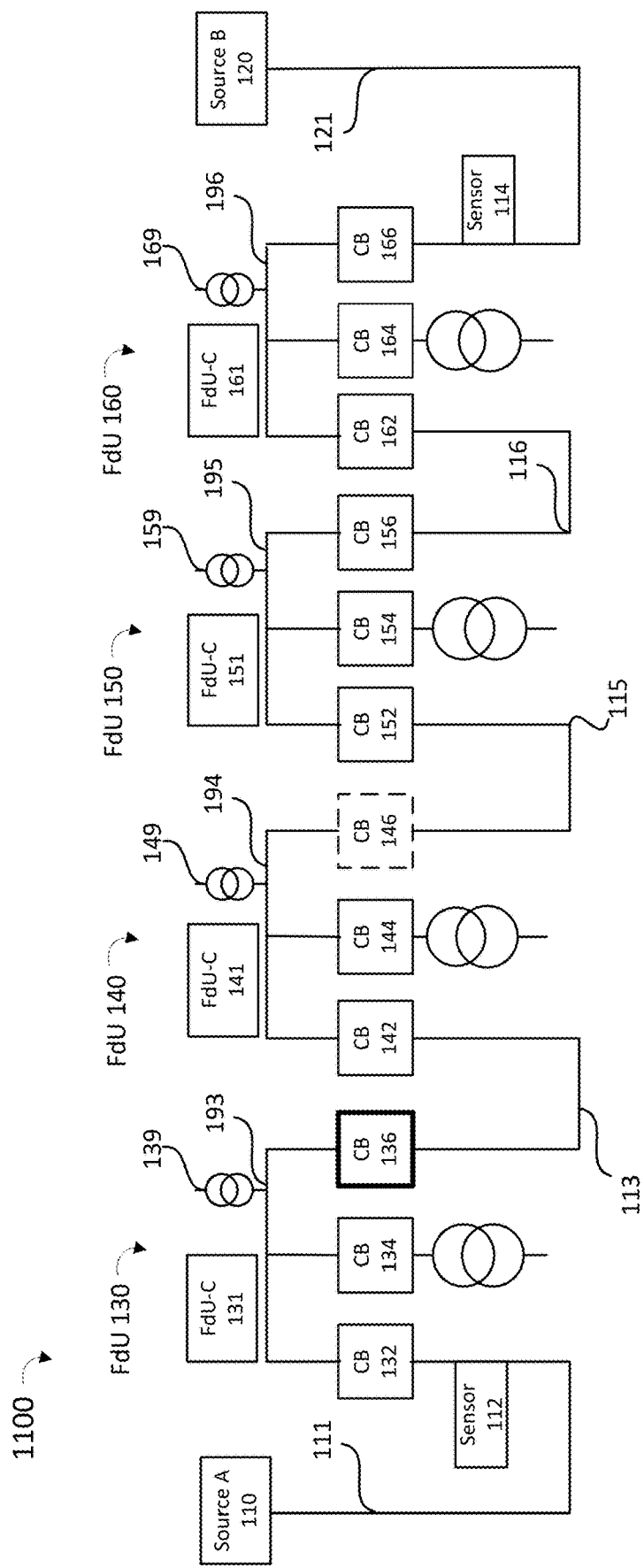
FIG. 11 illustrates the operation of a power system architecture when a breaker fails to open, according to aspects of the disclosure.

FIG. 11 illustrates the operation of power system architecture 1100, which may be compared to power system architecture 100, when a breaker fails to open. In the example shown in FIG. 11, FdU 140 is the Primary FdU and breaker CB 146 is the Primary Open Point breaker. The Primary Open Point breaker CB 146 is initially open, as illustrated by the dashed box. In normal operation, FdUs 130 and 140 receive power from Source A 110 and FdUs 150 and 160 receive power from Source B 120. In this example, breaker CB 146 is also selected as the Restoration Point.

An operator, such as a technician or other individual, may manually select a new Prefer Open Point within the power system architecture 1100. In the example illustrated in FIG. 11, the operator selects breaker CB 136 of FdU 130 as the Prefer Open Point (illustrated by the darkened box) via a selector switch. After the operator selects the new Prefer Open Point, FdU-C 131 may assign breaker CB 136 as the Prefer Open Point breaker. Subsequently, FdU-C 131 may open the Prefer Open Point breaker if the Primary Open Point Ready to Close signal indicates that the Primary Open Point breaker 146 can be closed. In the event the Primary Open Point Ready to Close signal indicates the Primary Open Point breaker 146 can be closed, FdU-C 131 may attempt to open Prefer Open Point breaker 136, such as by using a trip coil. However, in the example illustrated in FIG. 11, breaker CB 136 fails to open. FdU-C 131 may detect the failure of breaker CB 136 to open and trigger an alarm indicating that the breaker has failed to open. The alarm may be a visual and/or audible alarm. In some instances, the alarm may also include providing notifications to an operator, centralized monitoring system, etc., so that an operator/technician can investigate the issue.

FdU-C 146 may not close Primary Open point breaker CB 146 in this scenario, as condition (3) of the following conditions is not met: (1) voltage is present in the loop, such as indicated by a shared signal or determined via one or more sensors; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source. Although the example illustrated by FIG. 11 describes the operation of the power system architecture 1100 when a breaker fails to open during the selection of a Prefer Open Point, similar operations may occur if a breaker fails to open during a restoration process or during other manual operations.

Failure of a Breaker to Open—Loss of Source

Figure 12:
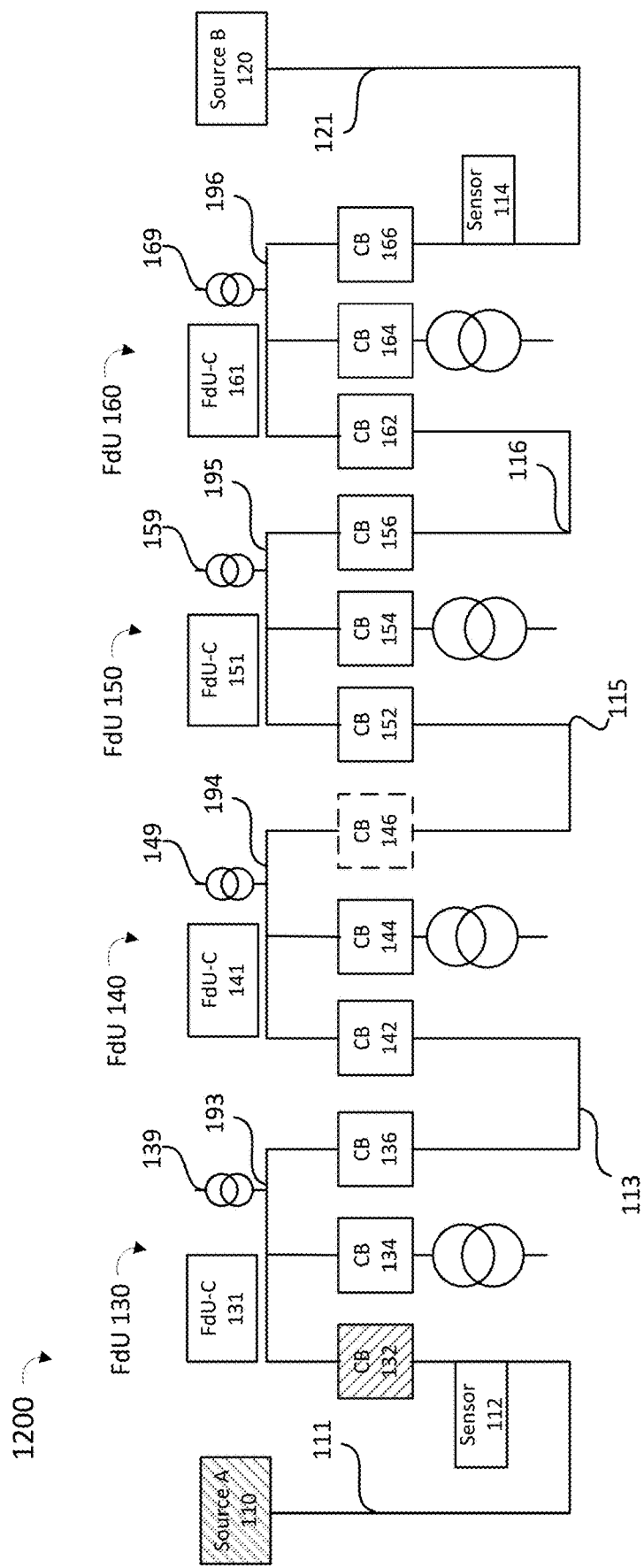
FIG. 12 illustrates another example of the operation of a power system architecture when a breaker fails to open, according to aspects of the disclosure.

FIG. 12 illustrates the operation of power system architecture 1200, which may be compared to power system architecture 100, when a breaker fails to open upon loss of a power source. In the example shown in FIG. 12, FdU 140 is the Primary FdU and breaker CB 146 is the Primary Open Point breaker. The Primary Open Point breaker CB 146 is initially open, as illustrated by the dashed box. In normal operation, FdUs 130 and 140 receive power from Source A 110 and FdUs 150 and 160 receive power from Source B 120. In this example, breaker CB 146 is also selected as the Restoration Point.

In the example shown in FIG. 12, power source A 110 stops providing power, as illustrated by the shaded box. After loss of power source A 110, FdU-C 131 may detect a loss of power source based on its bus sensor. For instance, bus sensor 139 may detect a loss of voltage (or current) on bus 193, as power from Source A 110 is no longer received. FdU-C 131 may determine, based on signals provided by bus sensor 139, that no power is available on bus 193. In response to detecting the loss of the power source, FdU-C 131 may assign its end-side breaker as the Prefer Open Point breaker. The end-side breaker is the breaker closest to the power source, which for FdU 130 is breaker CB 132 (indicated by the shading in FIG. 12.)

FdU-C 131 may open the Prefer Open Point (breaker CB 132) if a Primary Open Point Ready to Close signal is received, meaning that Primary Open Point can be closed. The Primary Open Point Ready to Close signal may be a signal provided by the FdU-C associated with the FdU-C containing the Primary Open Point breaker (such as a high signal or low signal that indicates whether the Primary Open Point is ready to close or not). As previously described, breaker CB 146 is the Primary Open Point breaker. Accordingly, the Primary Open Point Ready to Close signal may be provided by FdU-C 141 to the other FdU-Cs via the common bus 180.

When FdU-C 130 receives the Primary Open Point Ready to Close signal indicating the Primary Open Point breaker is ready to close, FdU-C 131 may attempt to open Prefer Open Point breaker 132, such as by using a first trip coil. However, in the example illustrated in FIG. 12, breaker CB 132 fails to open using the first trip coil. FdU-C 131 may detect the failure of breaker CB 132 to open using the first trip coil and attempt to open Prefer Open Point breaker 132 using a second trip coil. In the event the second trip coil also fails, FdU-C 131 may detect the failure and open breaker CB 136 instead. Although only two trip coils are described, a breaker may have any number of trip coils. FdU-C 131 sends a shared signal to other FdU-Cs indicating that FdU 130 has at least one open point. The shared signal may be transmitted via common bus 180.

FdU-C 141 may detect the additional open point signal. Further, FdU-C 141 may also determine breaker CB 146, as the Primary Open Point breaker, is also open, indicating that there are two open points in the power system architecture. FdU-C 141 may close breaker CB 146 upon determining there are two open points in the power system architecture 1200 if the following conditions are met: (1) voltage is present in the loop; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close and Primary Open Point Ready to Close Signal may be High if the FdU-C determines a voltage (or current) is being detected at a line sensor, indicating power is being provided by the power source. After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 131 may detect only one open point in the loop, breaker CB 136. After detecting only one open point, FdU-C 131 may designate its open point (breaker CB 136) as the Primary Open Point breaker if the following conditions are met: (i) only one open point in the loop, (ii) the Prefer Open Point breaker's interlocks (used to control the open and closed status of the breaker) are healthy (in this scenario, breaker CB 132 is the Prefer Open Point breaker); and (iii) the Primary Open Point Ready to Close signal indicates there is no Primary Open Point that is ready to close (e.g., the Primary Open Point Ready to Close signal is low or indicates that the Primary Open Point is already closed.) After determining these conditions are met, FdU-C 131 may assign its Prefer Open Point, breaker CB 136, which is open, as the Primary Open Point breaker. Once FdU-C 131 assigned breaker CB 136 as the Primary Open Point breaker, FdU 130 no longer has a Prefer Open Point, as it has been converted to the Primary Open Point breaker. At the completion of this process, the power system architecture has only one open point (breaker CB 136) and FdU 130 includes the Primary Open Point breaker. Breaker CB 146 of FdU 140 remains the Restoration Point.

Failure of a Breaker to Close

Figure 13:
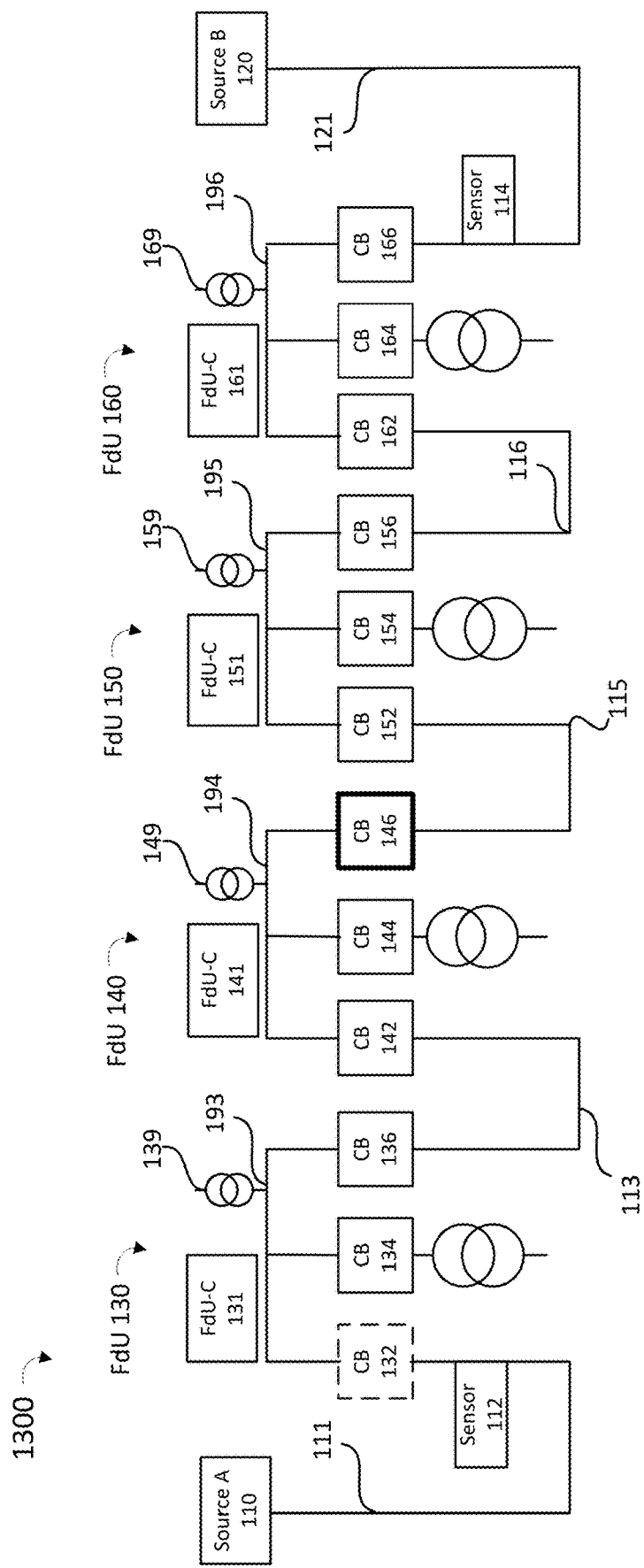
FIG. 13 illustrates the operation of a power system architecture when a breaker fails to close, according to aspects of the disclosure.

FIG. 13 illustrates the operation of power system architecture 1300, which may be compared to power system architecture 100, when a breaker, such as a Primary Open Point breaker, fails to close. In the example shown in FIG. 13, FdU 130 is the Primary FdU and breaker CB 132 is the Primary Open Point breaker. The Primary Open Point breaker CB 132 is initially open, as illustrated by the dashed box. In normal operation, all FdUs 130-160 receive power from Source B 120. In this example, breaker CB 146 is selected as the Restoration Point.

In this example, breaker CB 146 is selected, such as by a technician or operator, as a Prefer Open Point, as illustrated by the darkened box and breaker CB 146 open. FdU-C 131 may detect that two breakers are now open and attempt to close Primary Open Point breaker 132 following the steps of manual selection of the Prefer Open Point by the operator. However, Primary Open Point breaker 132 may fail to close, which is detected by FdU-C 131. In response, FdU-C 131 may send a shared signal (Primary Open Point Failed to Close signal) indicating that Primary Open Point has failed to open over the common bus 180. FdU-C 131 may also generate a "fail to close" (FTC) alarm and indicate within the Primary Open Point Ready to Close signal, that the Primary Open Point is not ready to close, thereby preventing self-Healing logic from continuing. In some instances, FdU-C 131 may cease providing the Primary Open Point Ready to Close signal, indicating that the Primary Open Point is not ready to close.

FdU-C 141 may detect the shared signal Primary Open Point Fails to Close and the Primary Open Point Failed to Close signal. In response to the received shared signals, FdU-C 141 may close Prefer Open Point breaker CB 146. The power system architecture 1300 then has one open point in the loop, breaker CB 132—the breaker that failed to close.

FdU-C Failure

Figure 14:
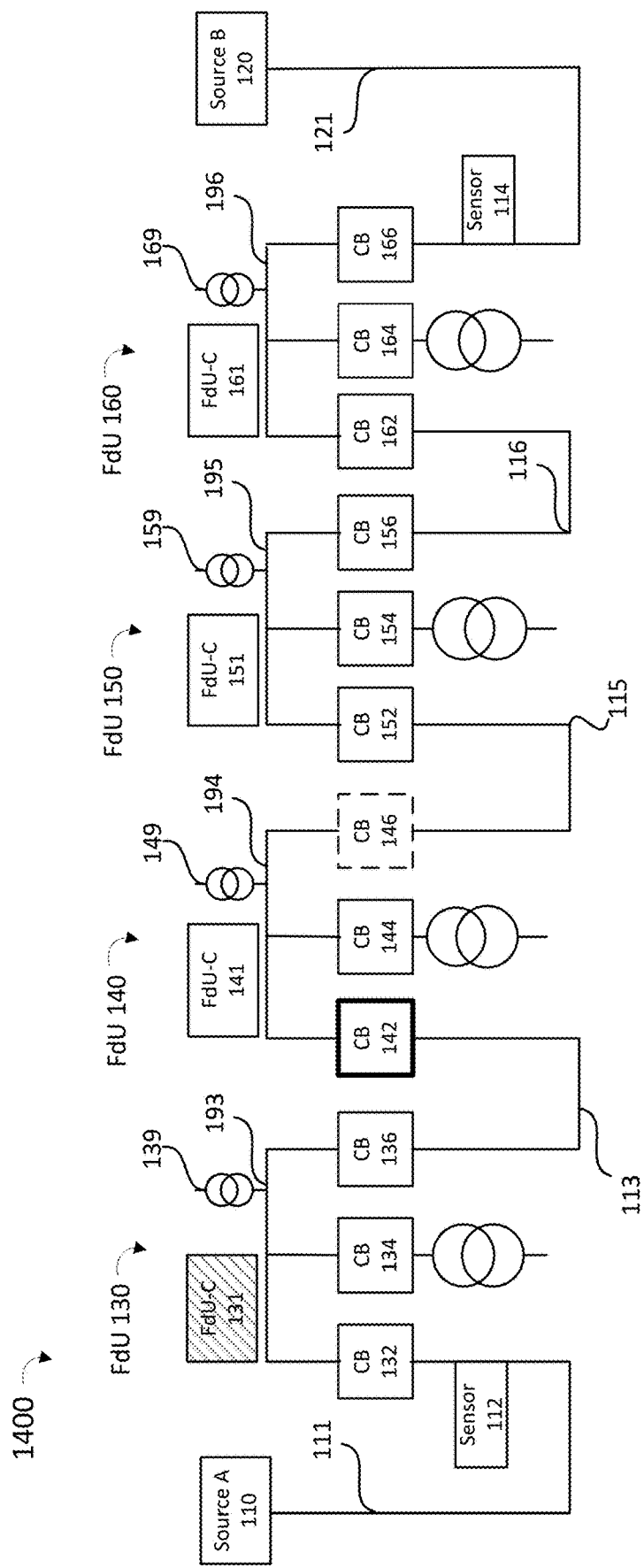
FIG. 14 illustrates the operation of a power system architecture when a feeder unit controller fails, according to aspects of the disclosure.

FIG. 14 illustrates the operation of power system architecture 1400, which may be compared to power system architecture 100, when a FdU fails. In the example shown in FIG. 14, FdU 140 is the Primary FdU and breaker CB 146 is the Primary Open Point breaker. The Primary Open Point breaker CB 146 is initially open, as illustrated by the dashed box. In this example, breaker CB 146 is also selected as the Restoration Point.

In this example, FdU-C 131 fails, as illustrated by the shading of FdU-C 131 in FIG. 14. FdU-C 141 may detect the failure of FdU-C 131. In this regard, FdU-C 141 may be connected to FdU-C 131 via status communication line 185 (shown in FIG. 1C). Upon FdU-C 131 failing, the status signal provided by FdU-C 131 on status communication line 185 may no longer be present or indicate that FdU-C 131 has failed. In some instances, FdU-C 131 may provides its failure status on the communication line, such as via 185. In this regard, FdU-C 131 may include a fail safe contact, such that once power is lost or some type of internal failure occurs, a contact(s) closes indicating that the FdU-C has failed.

FdU-C 141 may also detect a loss of power on bus 194, as power from Source A 110 does not flow through FdU 130 when FdU-C 131 fails. Accordingly, FdU-C may operate as an end-side FdU-C and assign its end-side breaker (breaker CB 142) as the Prefer Open Point. FdU-C 141 may open the Prefer Open Point if Primary Open Point Ready to Close signal indicates the Primary Open Point breaker 146 is ready to close. In the event the Primary Open Point breaker is ready to close, FdU-C 141 may open Prefer Open Point breaker CB 142 and send a shared signal to other FdU-Cs indicating that it has at least one open point.

FdU-C 141 may detect at least two open points and close its Primary Open Point (breaker CB 146) if the following conditions are met: (1) voltage is present in the loop, such as indicated by a shared signal or determined via one or more sensors; (2) breaker CB 146 interlocks are healthy; and (3) at least two open points exists in the loop. If FdU is an end FdU and Primary Open Point breaker is an end Open Point, then Primary Open Point breaker may close if there is voltage (or current) at the line side voltage (or current) sensor.

After determining the aforementioned conditions are met, FdU-C 141 may (i) close Primary Open Point breaker CB 146, (ii) once the Primary Open Point breaker CB 131462 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.) After the Primary Open Point breaker 146 is closed, FdU-C 141 may detect only one open point in the loop, Prefer Open Point breaker 142. After detecting only one open point, FdU-C 141 may designates its Prefer Open Point breaker 142 as the Primary Open Point breaker if the following conditions are met: (i) only one open point in the loop, (ii) the Prefer Open Point breaker's interlocks are healthy (in this example, breaker CB 142 is the Prefer Open Point Breaker); and (iii) the Primary Open Point Ready to Close signal indicates there is no Primary Open Point that is ready to close (e.g., the Primary Open Point Ready to Close signal is low or indicates that the Primary Open Point is already closed.) After determining the conditions are met, FdU-C 141 may assign its Prefer Open Point, breaker CB 142, which is open, as the Primary Open Point breaker. Once FdU-C 141 assigned breaker CB 142 as the Primary Open Point breaker, FdU 140 no longer has a Prefer Open Point, as it has been converted to the Primary Open Point breaker. At the completion of this process, the power system architecture has only one open point (breaker CB 142) and FdU 140 includes the Primary Open Point breaker. Breaker CB 146 of FdU 140 remains as the Restoration Point.

Primary Open Point FdU-C in Manual Mode and Loss of Single Source

Figure 15:
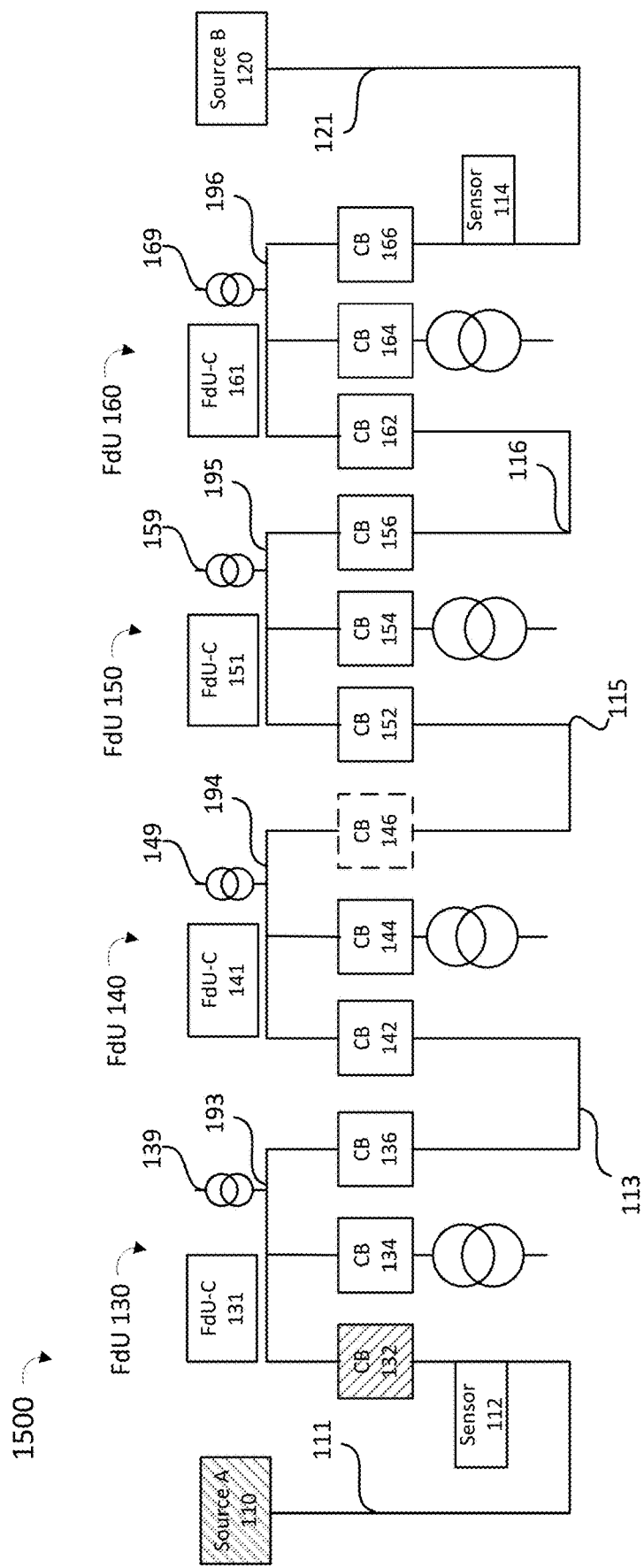
FIG. 15 illustrates the operation of a power system architecture when a feeder unit controller is in manual mode and a single power source is unavailable, according to aspects of the disclosure.

FIG. 15 illustrates the operation of a power system architecture 1500, which may be compared to power system architecture 100, when a single power source is unavailable and the Primary Open Point breaker and Restoration Point are within an FdU placed into manual mode. In the example shown in FIG. 15, power system architecture 1500 loses source A 110. The loss of source A 110 is illustrated by shading of source A 110. In normal operation, FdUs 130 and 140 receive power from Source A 110 and FdUs 150 and 160 receive power from Source B 120.

As initially configured, FdU 140 is the Primary FdU and breaker CB 146 is the Primary Open Point breaker. As the Primary Open Point, breaker CB 146 is initially open, as illustrated by the dashed box. In this example, breaker CB 146 is also selected as the Restoration Point. As described in more detail herein, a Restoration Point may be a breaker which becomes a Primary Open Point breaker when a restoration signal is detected, as described herein. Further, FdU 140 is in manual mode.

When FdU-C 141 is put in manual mode, FdU-C 141 sets Primary Open Point Ready to Close shared signal to Low, or otherwise sets the Primary Open Point Ready to Close shared signal to indicate that the Primary Open Point breaker CB 146 is not ready to close.

After loss of power source A 110, FdU-C 131 may detect a loss of power source based on its bus sensor. For instance, bus sensor 139 may detect a loss of voltage (or current) on bus 193, as power from Source A 110 is no longer received. FdU-C 131 may determine, based on signals provided by bus sensor 139, that no power is available on bus 193. In response to detecting the loss of the power source, FdU-C 131 may assign its end-side breaker as the Prefer Open Point breaker. The end-side breaker is the breaker closest to the power source, which for FdU 130 is breaker CB 132 (indicated by the shading in FIG. 15.)

FdU-C 131 may open the Prefer Open Point (breaker CB 132) if a Primary Open Point Ready to Close signal is received, meaning that Primary Open Point can be closed. However, since FdU-C 141 set the Primary Open Point Ready to Close signal to indicate that the Primary Open Point breaker 146 is not ready to close, FdU-C 131 may not open Prefer Open Point breaker CB 132 and self-healing logic may stop.

Once FdU-C 141 is put into automatic mode, such as by an operator, FdU-C 141 may set the Primary Open Point Ready to Close shared signal to indicate that the Primary Open Point breaker CB 146 is ready to close. When FdU-C 130 receives the Primary Open Point Ready to Close signal indicating the Primary Open Point breaker is ready to close, FdU-C 131 may open its Prefer Open Point, breaker CB 132, and send a shared signal, via common bus 180, to the other FdU-Cs 140, 150, 160, indicating that FdU 130 has at least one open point-breaker CB 132.

FdU-C 141 may detect the additional open point signal. Further, FdU-C 141 may also determine breaker CB 146, as the Primary Open Point breaker, is also open, indicating that there are two open points in the power system architecture. FdU-C 141 may close breaker CB 146 upon determining there are two open points in the power system architecture 1500 if the following conditions are met: (1) voltage is present in the loop; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source. After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 131 may detect only one open point in the loop, breaker CB 132. After detecting only one open point, FdU-C 131 may designates its open point (breaker CB 132) as the Primary Open Point breaker if the following conditions are met: (i) only one open point in the loop, (ii) the Prefer Open Point breaker's interlocks (used to control the open and closed status of the breaker) are healthy (in this scenario, breaker CB 132 is the Prefer Open Point breaker); and (iii) the Primary Open Point Ready to Close signal indicates there is no Primary Open Point that is ready to close (e.g., the Primary Open Point Ready to Close signal is low or indicates that the Primary Open Point is already closed.) After determining these conditions are met, FdU-C 131 may assign its Prefer Open Point, breaker CB 132, which is open, as the Primary Open Point breaker. Once FdU-C 131 assigned breaker CB 132 as the Primary Open Point breaker, FdU 130 no longer has a Prefer Open Point, as it has been converted to the Primary Open Point breaker. At the completion of this process, the power system architecture has only one open point (breaker CB 132) and FdU 130 includes the Primary Open Point breaker. Breaker CB 146 of FdU 140 remains as the Restoration Point.

Open Breaker in Manual Mode

Figure 16:
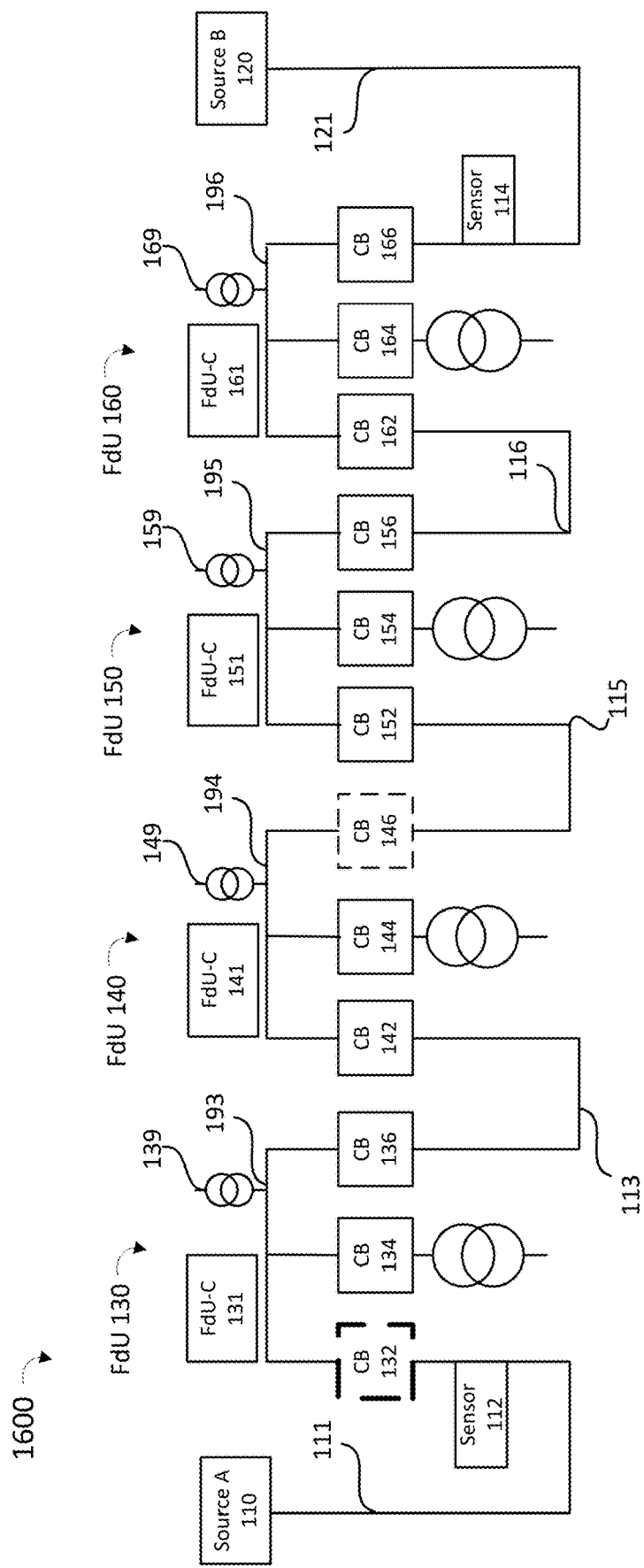
FIG. 16 illustrates the operation of a power system architecture when a breaker is opened in manual mode, according to aspects of the disclosure.

FIG. 16 illustrates the operation of a power system architecture 1600, which may be compared to power system architecture 100, when a breaker is opened manually. In the example shown in FIG. 16, breaker CB 132 is opened manually, such as by an operator, as illustrated by the darkened dashed lines. In initial operation, FdUs 130 and 140 receive power from Source A 110 and FdUs 150 and 160 receive power from Source B 120.

As initially configured, FdU 140 is the Primary FdU and breaker CB 146 is the Primary Open Point breaker. As the Primary Open Point, breaker CB 146 is initially open, as illustrated by the dashed box. In this example, breaker CB 146 is also selected as the Restoration Point. As described in more detail herein, a Restoration Point may be a breaker which becomes a Primary Open Point breaker when a restoration signal is detected, as described herein. Further, FdU 130 is in manual mode.

When breaker CB 132 is opened manually, FdU-C 131 may send a shared signal, via common bus 180, to the other FdU-Cs 140, 150, 160, indicating that FdU 130 has at least one open point-breaker CB 132.

FdU-C 141 may detect the additional open point signal. Further, FdU-C 141 may also determine breaker CB 146, as the Primary Open Point breaker, is also open, indicating that there are two open points in the power system architecture. FdU-C 141 may close breaker CB 146 upon determining there are two open points in the power system architecture 1600 if the following conditions are met: (1) voltage is present in the loop, such as indicated by a shared signal or determined via one or more sensors; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source. After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 131 may detect only one open point in the loop, breaker CB 132. After detecting only one open point, FdU-C 131 may designate breaker 132 as the Primary Open Point breaker if the following conditions are met: (i) Only one open point in the loop, (ii) the Prefer Open Point breaker's interlocks are healthy; and (iii) the Primary Open Point Ready to Close signal indicates there is no Primary Open Point that is ready to close (e.g., the Primary Open Point Ready to Close signal is low or indicates that the Primary Open Point is already closed.) In this scenario, conditions (i) and (iii) are met, but not condition (ii) because the interlocks of breaker 132 are not healthy since the FdU 130 is in manual mode. Accordingly, FdU-C 131 self-healing logic is not active as a Primary Open Point is undetermined. However, once the operator places FdU 130 into automatic mode, condition (ii) will be met and FdU-C 131 may designate its open point (breaker CB 132) as the Primary Open Point breaker. Further, FdU-C 131 may assign the Primary Open Point as the new Restoration Point.

Selecting Primary Open Point Breaker in Manual Mode

Figure 17:
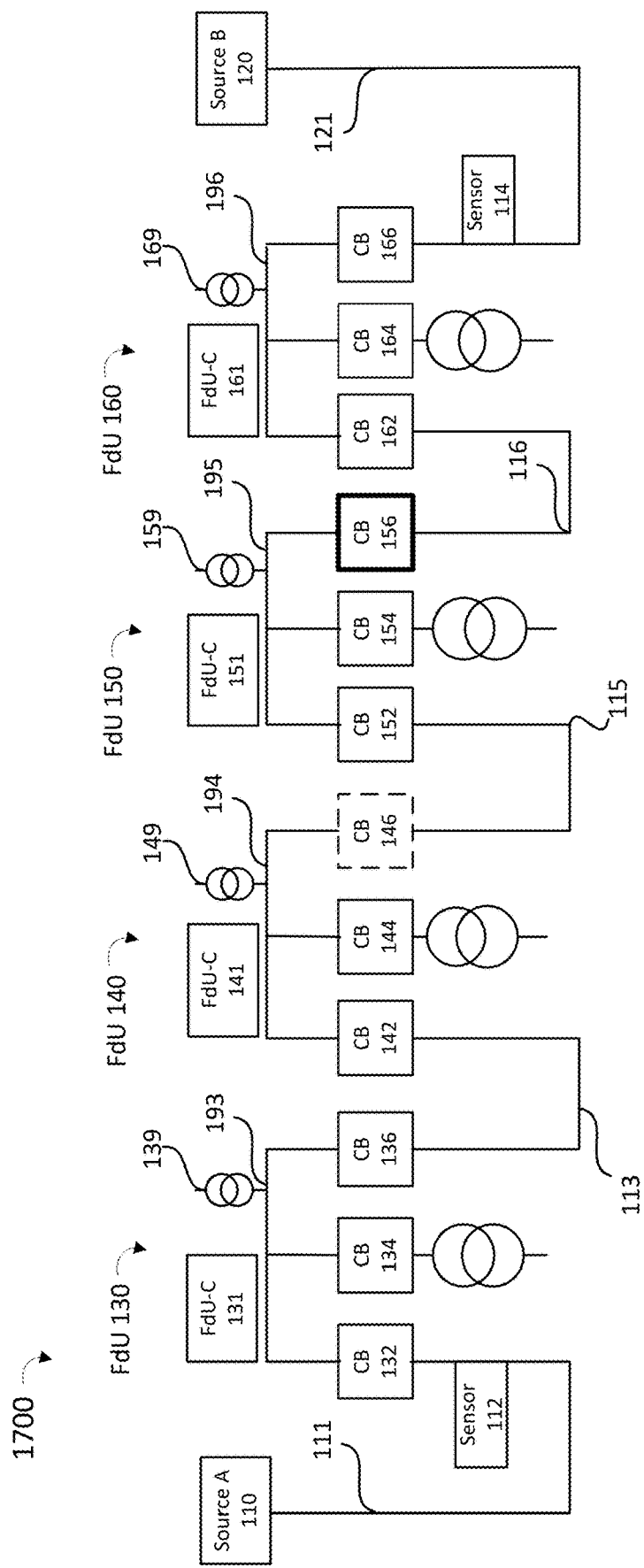
FIG. 17 illustrates the operation of selecting a Primary Open Point in manual mode, according to aspects of the disclosure.

FIG. 17 illustrates the operation of a power system architecture 1700, which may be compared to power system architecture 100, when a Primary Open Point breaker is selected manually. In the example shown in FIG. 17, breaker CB 156 of FdU 150 is selected as the Prefer Open Point breaker, such as by an operator, as illustrated by the darkened line. In initial operation, FdUs 130 and 140 receive power from Source A 110 and FdUs 150 and 160 receive power from Source B 120.

As initially configured, FdU 140 is the Primary FdU and breaker CB 146 is the Primary Open Point breaker. As the Primary Open Point, breaker CB 146 is initially open, as illustrated by the dashed box. In this example, breaker CB 146 is also selected as the Restoration Point. Further, FdU 150 is in manual mode.

In the example of FIG. 17, FdU 150 is put in manual mode and breaker CB 156 is selected as the Prefer Open Point breaker by an operator. As FdU 150 is in manual mode, FdU-C 151 is unable to open breaker CB 156. However, once the operator puts FdU 150 back into automatic mode, FdU-C 151 may open Prefer Open Point breaker 156. FdU-C 151 may send a shared signal, via common bus 180, to the other FdU-Cs 130, 140, 160, indicating that FdU 150 has at least one open point-breaker CB 156.

FdU-C 141 may detect the additional open point signal. Further, FdU-C 141 may also determine breaker CB 146, as the Primary Open Point breaker, is also open, indicating that there are two open points in the power system architecture. FdU-C 141 may close breaker CB 146 upon determining there are two open points in the power system architecture 1700 if the following conditions are met: (1) voltage is present in the loop; (2) breaker CB 146 interlocks are healthy; and (3) at least two open points exist in the loop. In instances where the Primary FdU is at the other end of the loop, and the Primary Open Point Breaker is the last breaker before the power source, the Primary Open Point breaker may close if the FdU-C determines a voltage (or current) is being detected at a line sensor, indicating power is being provided by the power source. After determining the aforementioned conditions are met, FdU-C 141 may (i) close Primary Open Point breaker CB 146, (ii) once the Primary Open Point breaker CB 146 is closed, clear Primary Open Point status from FdU 140, and (iii) cease providing the Primary Open Point Ready to Close signal (or providing a Primary Open Point Ready to Close signal that indicates the Primary Open Point is already closed or is not ready to close.)

After the Primary Open Point breaker 146 is closed, FdU-C 151 may detect only one open point in the loop, breaker CB 156. After detecting only one open point, FdU-C 151 may designate breaker CB 156 as the Primary Open Point breaker if the following conditions are met: (i) Only one open point in the loop, (ii) the Prefer Open Point breaker's interlocks are healthy (i.e., breaker CB 156); and (iii) the Primary Open Point Ready to Close signal indicates there is no Primary Open Point that is ready to close (e.g., the Primary Open Point Ready to Close signal is low or indicates that the Primary Open Point is already closed.) Upon determining the conditions are met, FdU-C 151 may designate its open point (breaker CB 156) as the Primary Open Point breaker. Further, FdU-C 151 may assign the Primary Open Point as the new Restoration Point.

Although the technology herein has been described with reference to particular examples, it is to be understood that these examples are merely illustrative of the principles and applications of the Present technology. It is, therefore, to be understood that numerous modifications may be made to the illustrative examples and that other arrangements may be devised without departing from the spirit and scope of the present technology as defined by the appended claims. For instance, although the example operations are shown using certain components of the power system architectures it should be understood similar operations may be performed by similar components of the power system architectures.

Unless otherwise stated, the foregoing alternative examples are not mutually exclusive but may be implemented in various combinations to achieve unique advantages. As these and other variations and combinations of the features discussed above can be utilized without departing from the subject matter defined by the claims, the foregoing description of the examples should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only

The invention claimed is:

1. A power system architecture comprising:
    a plurality of feeder units electrically daisy-chained together via respective voltage buses, each of the plurality of feeder units comprising a voltage bus, two or more breakers, and a feeder unit controller; and
    a common bus communicatively connecting the feeder unit controllers together, wherein each of the feeder unit controllers is connected to the common bus via one or more communication lines,
    wherein each of the feeder unit controllers is configured to control the operation of the two or more breakers of the feeder unit comprising the respective feeder unit controller,
    wherein the plurality of feeder units includes:
    a first feeder unit at a first end of the daisy-chain connected to a first power source;
    a second feeder unit at a second end of the daisy-chain connected to a second power source; and
    one or more interior feeder units positioned between the first feeder unit and the second feeder unit, wherein each of the one or more interior feeder units is connected to immediately adjacent feeder units of the plurality of feeder units; and
    wherein each feeder unit controller of the plurality of feeder units is connected to feeder unit controllers of immediately adjacent feeder units via one or more status communication lines.

2. The power system architecture of claim 1, further comprising the first power source and the second power source.

3. The power system architecture of claim 1, wherein each feeder unit controller is configured to provide status information indicating the operating status of the respective feeder unit controller via the one or more status communication lines.

4. The power system architecture of claim 3, wherein for each feeder unit, a first breaker of the two or more breakers is connected to a first side of the voltage bus and a second breaker of the two or more breakers is connected to a second side of the voltage bus.

5. The power system architecture of claim 4, wherein each feeder unit includes a voltage sensor configured to sense voltage on the voltage bus of the respective feeder unit.

6. The power system architecture of claim 5, wherein the first feeder unit includes a line sensor configured to detect voltage on a line connecting the first power source to the first feeder unit.

7. The power system architecture of claim 6, wherein the second feeder unit includes a line sensor configured to detect voltage on a line connecting the second power source to the first feeder unit.

8. The power system architecture of claim 1, wherein each of the feeder unit controllers is configured to control the operation of the two or more breakers of its respective feeder unit by initiating opening or closing of at least one of the two or more breakers.

9. The power system architecture of claim 1, wherein the power system architecture is determined to be operating abnormally when the first feeder unit fails to detect power from the first power source and/or the second feeder unit fails to detect power from the second power source.

10. The power system architecture of claim 1, wherein in normal operation a single breaker is assigned as a primary breaker by the feeder unit controller of the feeder unit having the primary breaker.

11. The power system architecture of claim 10, wherein the feeder unit controller of the feeder unit having the primary breaker is configured to send on the common bus a shared signal indicating that the primary breaker is ready to close.

12. The power system architecture of claim 11, wherein each of the feeder unit controllers, other than the feeder unit controller sending the shared signal indicating that the primary breaker is ready to close, is configured to send on the common bus a shared signal indicating when one of the two or more breakers within the respective feeder unit is open.

13. The power system architecture of claim 12, wherein the feeder unit controller of the feeder unit having the primary breaker is configured to detect, on the common bus, the shared signal indicating when one of the two or more breakers within the respective feeder unit is open.

14. The power system architecture of claim 13, wherein the feeder unit controller of the feeder unit having the primary breaker is configured to, upon detecting the shared signal indicating when one of the two or more breakers within the respective feeder unit is open, initiate the closing of the primary breaker.

15. The power system architecture of claim 14, wherein the feeder unit controller of the feeder unit having the primary breaker is configured to send a shared signal indicating that the primary breaker is not ready to close or is already closed on the common bus.

16. The power system architecture of claim 15, wherein the feeder unit controller of the feeder unit having the open breaker is configured to assign the open breaker as the primary breaker after detecting the shared signal indicating that the primary breaker is not ready to close or is already closed.

17. The power system architecture of claim 1, wherein the plurality of feeder is configured to be operated manually by a user or automatically without the user's input.

18. The power system architecture of claim 1, wherein each of the plurality of feeder units is configured to be controlled independently from one another.

* * * * *